(12) United States Patent
Lassalle-Balier et al.

(10) Patent No.: US 10,746,820 B2
(45) Date of Patent: Aug. 18, 2020

(54) MAGNETIC FIELD SENSOR THAT CORRECTS FOR THE EFFECT OF A STRAY MAGNETIC FIELD USING ONE OR MORE MAGNETORESISTANCE ELEMENTS, EACH HAVING A REFERENCE LAYER WITH THE SAME MAGNETIC DIRECTION

(71) Applicant: Allegro MicroSystems, LLC, Manchester, NH (US)

(72) Inventors: Rémy Lassalle-Balier, Bures sur Yvette (FR); Bryan Cadugan, Bedford, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 12 days.

(21) Appl. No.: 16/157,317

(22) Filed: Oct. 11, 2018

(65) Prior Publication Data
US 2020/0116800 A1    Apr. 16, 2020

(51) Int. Cl.
*G01R 33/025*    (2006.01)
*G01R 33/09*    (2006.01)

(52) U.S. Cl.
CPC ......... *G01R 33/025* (2013.01); *G01R 33/093* (2013.01); *G01R 33/098* (2013.01)

(58) Field of Classification Search
None
See application file for complete search history.

(56) References Cited

U.S. PATENT DOCUMENTS 5,216,560 A    6/1993  Brug et al.
5,561,368 A   10/1996  Dovek et al.
(Continued)

FOREIGN PATENT DOCUMENTS

EP    2589975 A2    5/2013
EP    2752676 A1    7/2014

OTHER PUBLICATIONS

Notice of Allowance dated Dec. 23, 2019 for U.S. Appl. No. 15/895,418; 13 pages.
(Continued)

*Primary Examiner* — Jas A Sanghera
(74) *Attorney, Agent, or Firm* — Daly, Crowley, Mofford & Durkee, LLP

(57) ABSTRACT

A magnetic field sensor can include a magnetic field sensor can include a substrate having a major surface in an x-y plane with an x axis and a y axis. The magnetic field sensor can also have an external field sensing circuit disposed upon the substrate and responsive to an external magnetic field generated outside of the magnetic field sensor. The external field sensing circuit can include one or more magnetoresistance elements, each having a respective reference layer with a magnetic direction parallel to the y axis and in the x-y plane. The one or more magnetoresistance elements can be operable to generate a magnetoresistance element signal responsive to the external magnetic field. The external field sensing circuit can also include a component determination module coupled to receive the magnetoresistance element signal and operable to generate a measured x-dominant value and a measured y-dominant value, wherein the measured x-dominant value is indicative of an x component and a y component of the external magnetic field projected onto the x-y plane, wherein the measured x-dominant value more indicative of the x component and less indicative of the y component, wherein the measured y-dominant value is indicative of the x component and the y component, wherein the measured y-dominant value is more indicative of the y component and less indicative of the x component.

34 Claims, 28 Drawing Sheets

(56) References Cited

U.S. PATENT DOCUMENTS

| | | | |
|---|---|---|---|
| 6,166,539 | A | 12/2000 | Dahlberg et al. |
| 6,501,678 | B1 | 12/2002 | Lenssen et al. |
| 7,064,937 | B2 | 6/2006 | Wan et al. |
| 7,259,545 | B2 | 8/2007 | Stauth et al. |
| 7,838,133 | B2 | 11/2010 | Zhang et al. |
| 8,269,491 | B2 | 9/2012 | Cummings et al. |
| 9,046,562 | B2 | 6/2015 | Cummings et al. |
| 9,465,056 | B2 | 10/2016 | Han et al. |
| 10,060,880 | B2 | 8/2018 | Chen et al. |
| 2008/0258721 | A1 | 10/2008 | Guo et al. |
| 2009/0237075 | A1 | 9/2009 | Koss |
| 2010/0007344 | A1 | 1/2010 | Guo et al. |
| 2010/0277971 | A1 | 11/2010 | Slaughter et al. |
| 2014/0253106 | A1* | 9/2014 | Granig .................. G01R 33/06 324/207.14 |
| 2015/0022196 | A1 | 1/2015 | Hebiguchi et al. |
| 2015/0177286 | A1 | 6/2015 | Fuji et al. |
| 2015/0333254 | A1 | 11/2015 | Liu et al. |
| 2016/0359103 | A1 | 12/2016 | Fermon et al. |
| 2017/0314969 | A1 | 11/2017 | Ausserlechner et al. |
| 2018/0087889 | A1 | 3/2018 | Ausserlechner et al. |

OTHER PUBLICATIONS

U.S. Appl. No. 16/157,313, filed Oct. 11, 2018, Lassalle-Balier, et al.
U.S. Appl. No. 15/869,620, filed Jan. 12, 2018, Cadugan, et al.
U.S. Appl. No. 15/895,418, filed Feb. 13, 2018, Cadugan, et al.
Allegro MioroSystems, LLC Datasheet dated Dec. 1, 2017, ACS70331 High Sensitivity, 1 MHz, GMR-Based Current Sensor IC in Space-Saving Low Resistance QFN package; 22 pages.
Notice of Allowance dated Aug. 22, 2019 for U.S. Appl. No. 15/869,620; 11 pages.
Notice of Allowance dated Aug. 8, 2019 for U.S. Appl. No. 15/895,418; 10 pages.
Amendment and Request for Continued Examination (RCE) dated Sep. 30, 2019 for U.S. Appl. No. 15/895,418; 27 pages.
Extended European Search Report dated Mar. 3, 2020 for EP Application No. 19202154.1; 7 Pages.
U.S. Notice of Allowance dated Mar. 12, 2020 for U.S. Appl. No. 16/157,313; 14 Pages.

* cited by examiner

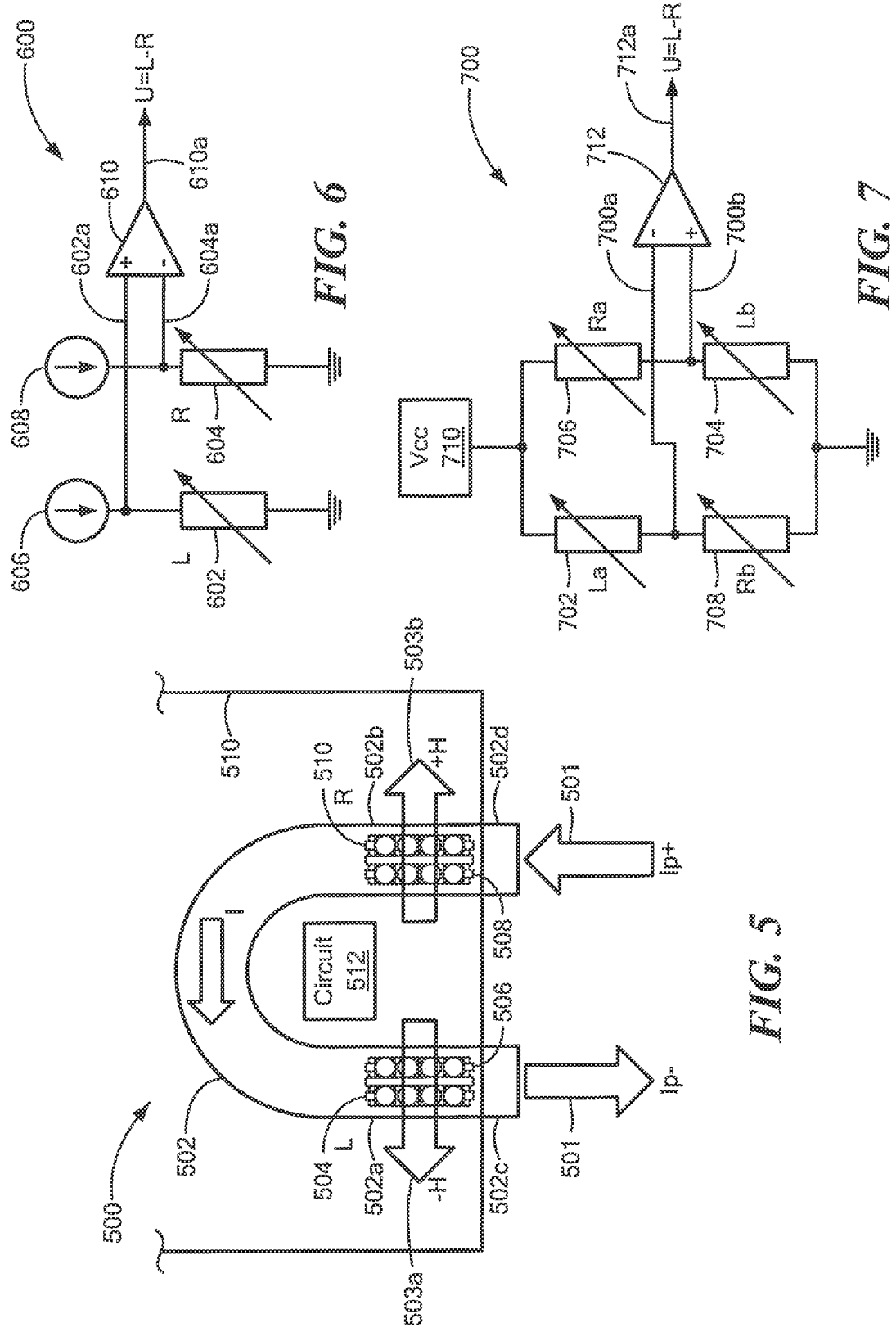

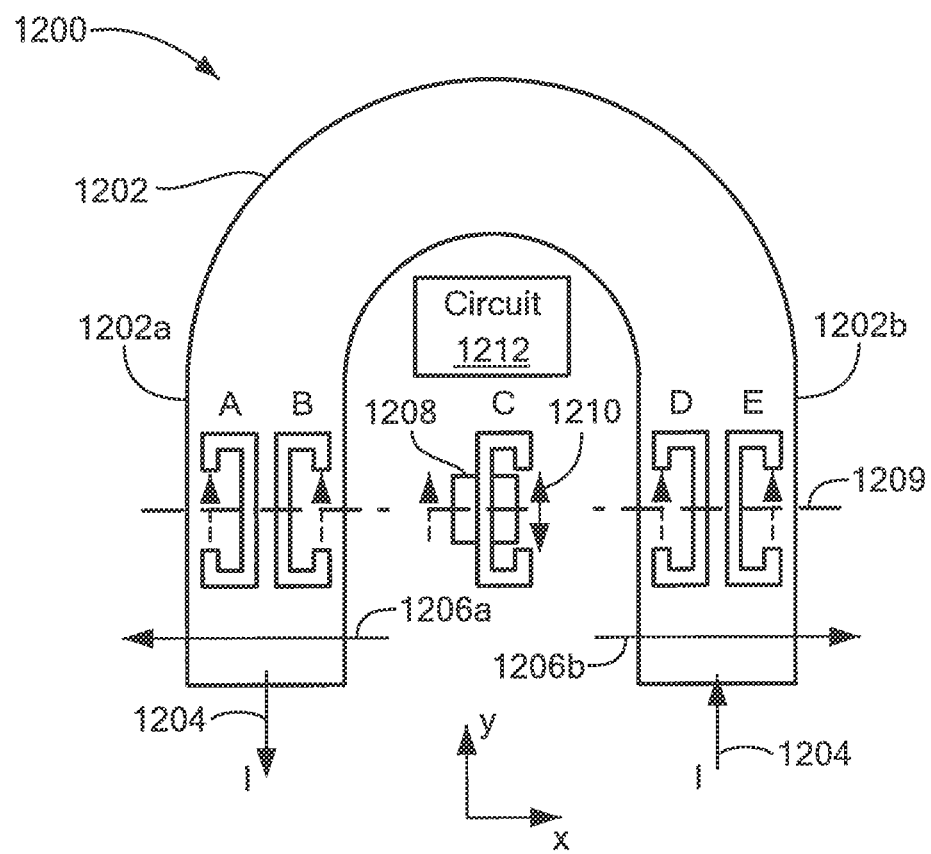
*FIG. 12*
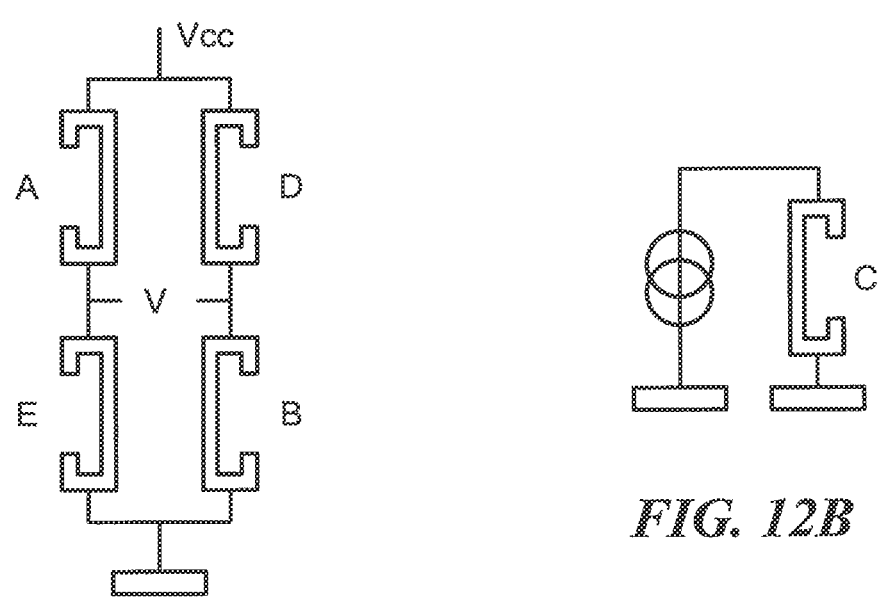
*FIG. 12A*
*FIG. 12B*

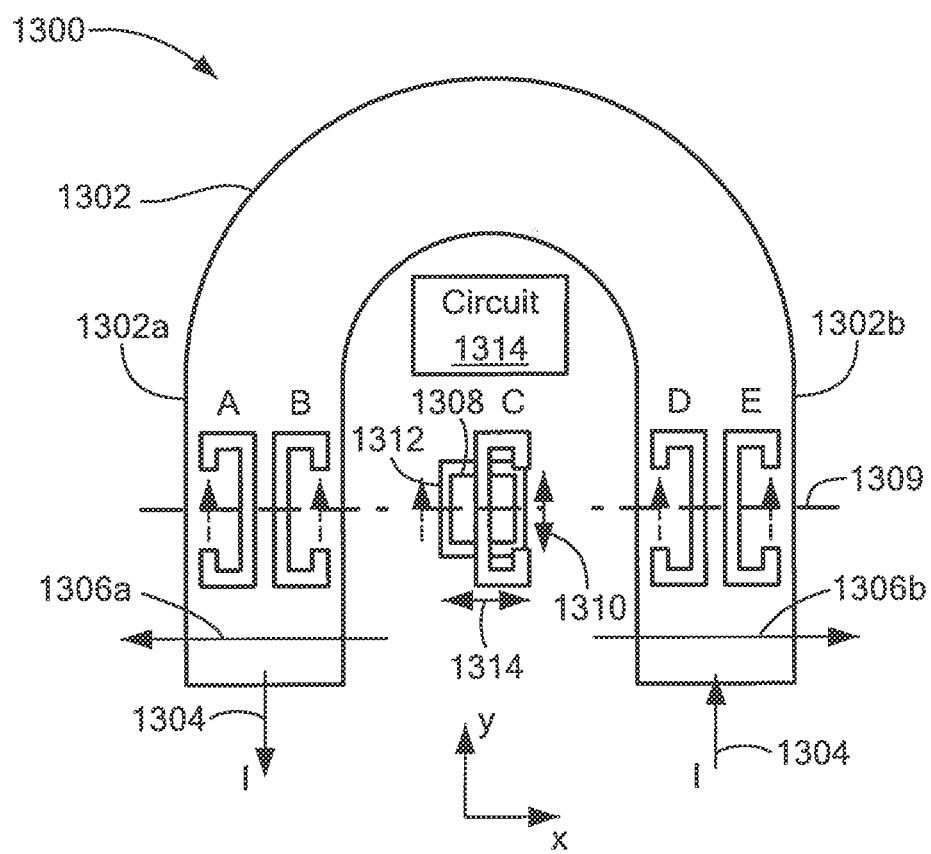
*FIG. 13*
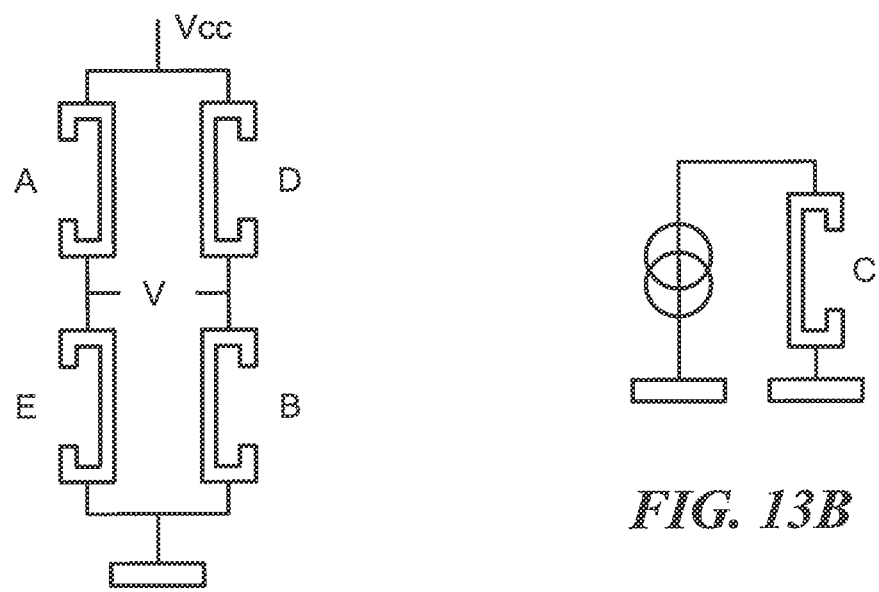
*FIG. 13A*
*FIG. 13B*

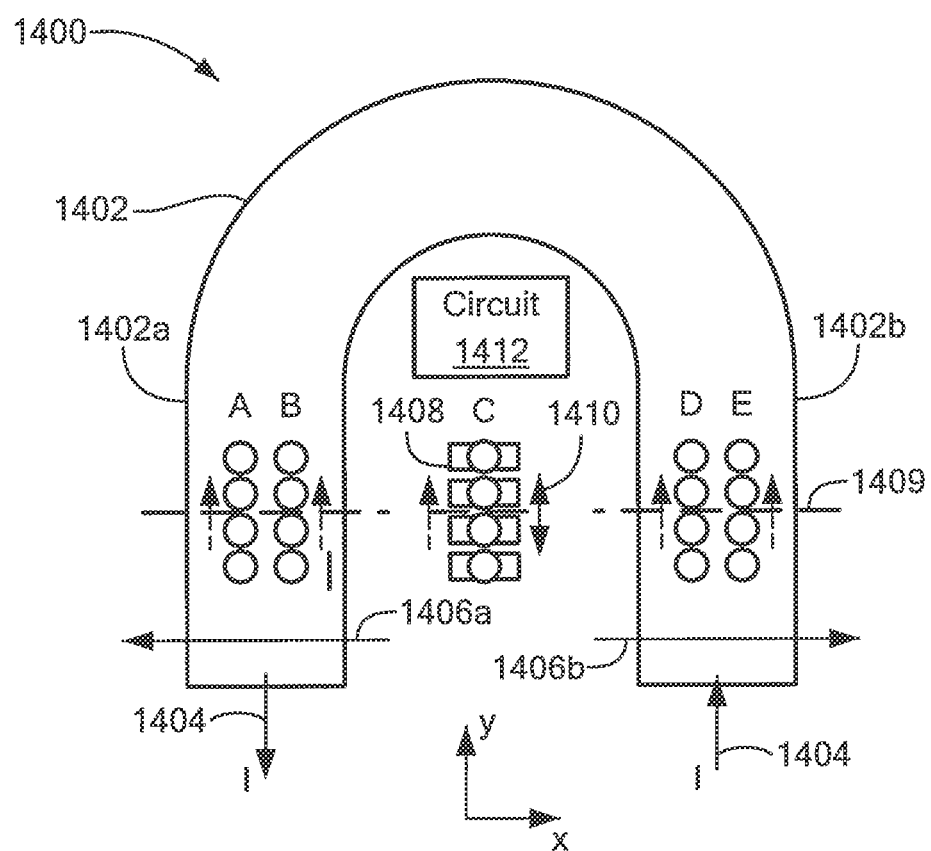
FIG. 14
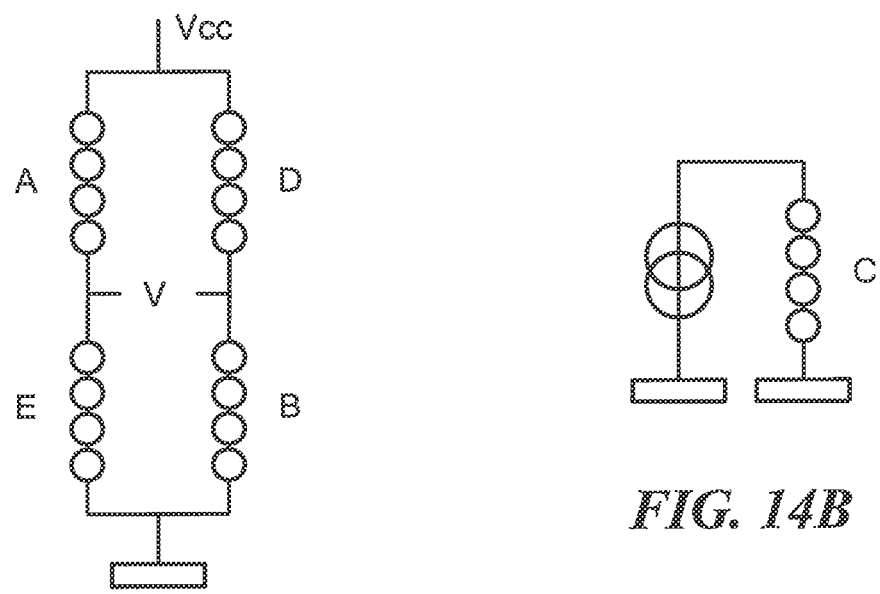
FIG. 14A  FIG. 14B

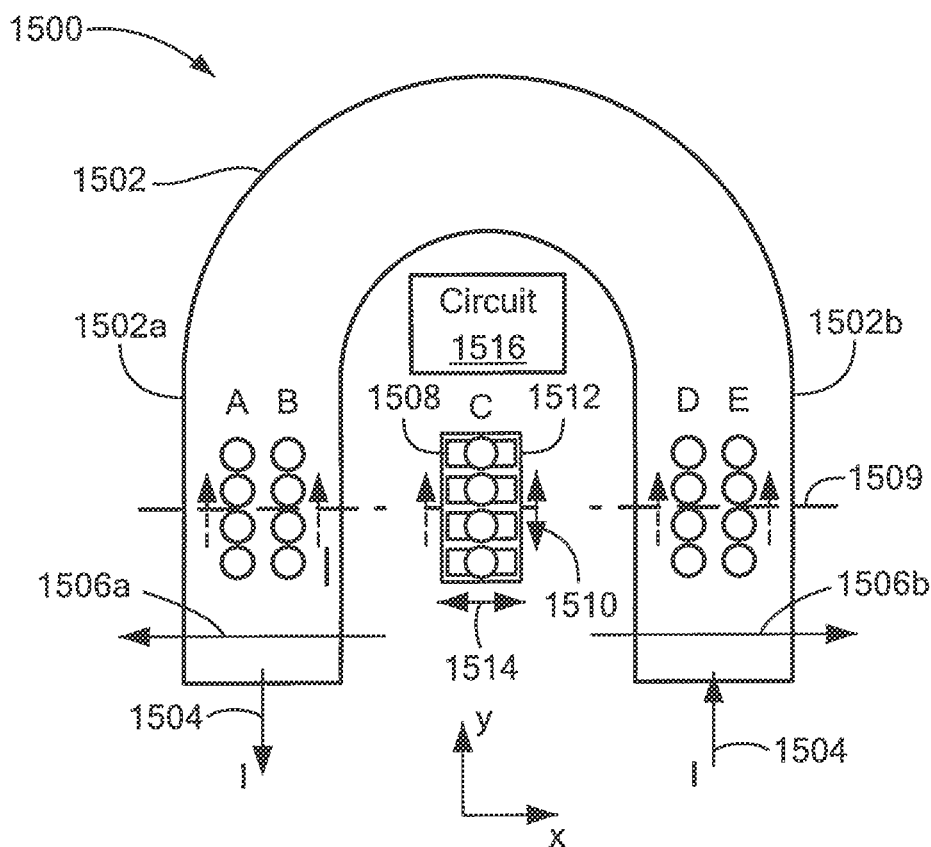
FIG. 15
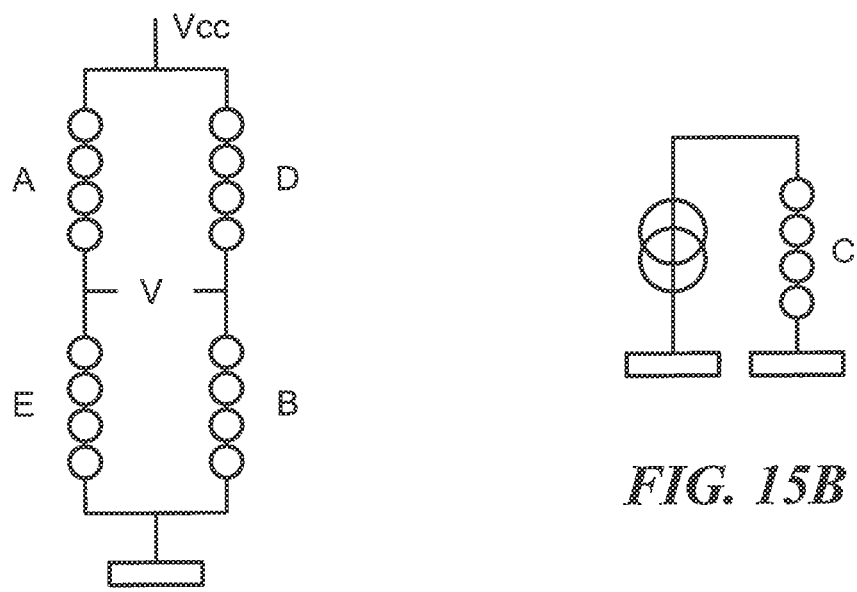
FIG. 15A
FIG. 15B

MAGNETIC FIELD SENSOR THAT CORRECTS FOR THE EFFECT OF A STRAY MAGNETIC FIELD USING ONE OR MORE MAGNETORESISTANCE ELEMENTS, EACH HAVING A REFERENCE LAYER WITH THE SAME MAGNETIC DIRECTION

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors, and, more particularly, to a magnetic field sensor that corrects for the effect of a stray magnetic field upon the magnetic field sensor using one or more magnetoresistance elements, each having a reference layer with the same magnetic direction.

BACKGROUND

As used herein, the term "magnetic field sensing element" is used to describe a variety of electronic elements that can sense a magnetic field. One such magnetic field sensing element is a magnetoresistance (MR) element. The magnetoresistance element has a resistance that changes in relation to a magnetic field experienced by the magnetoresistance element.

As is known, there are different types of magnetoresistance elements, for example, a giant magnetoresistance (GMR) element and a tunneling magnetoresistance (TMR) element, also called a magnetic tunnel junction (MTJ) element.

Of these magnetoresistance elements, the GMR and the TMR elements operate with spin electronics (i.e., electron spins) where the resistance is related to the magnetic orientation of different magnetic layers separated by nonmagnetic layers. In spin valve configurations, the resistance is related to an angular direction of a magnetization in a so-called "free-layer" relative to another layer so-called "reference layer." The free layer and the reference layer are described more fully below.

Most, but not all, magnetoresistance elements have a maximum response axis parallel to a substrate upon which they are formed.

The magnetoresistances element may be used as a single element or, alternatively, may be used as two or more magnetoresistance elements arranged in various configurations, e.g., a half bridge or full (Wheatstone) bridge.

As used herein, the term "magnetic field sensor" is used to describe a circuit that uses one or more magnetic field sensing elements, generally in combination with other circuits. In a typical magnetic field sensor, the magnetic field sensing element and the other circuits can be integrated upon a common substrate, for example, a semiconductor substrate. In some embodiments, the magnetic field sensor can also include a lead frame and packaging.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Various parameters characterize the performance of magnetic field sensors and magnetic field sensing elements. With regard to magnetic field sensing elements, the parameters include sensitivity, which is the change in the output signal of a magnetic field sensing element in response to a magnetic field, and linearity, which is the degree to which the output signal of a magnetic field sensor varies linearly (i.e., in direct proportion) to the magnetic field. The parameters also include offset, which describes and output from the magnetic field sensing element that is not indicative of zero magnetic field when the magnetic field sensor experiences a zero magnetic field.

GMR and TMR elements are known to have a relatively high sensitivity, compared, for example, to Hall effect elements. Thus, a current sensor that uses GMR or TMR elements can sense smaller currents than can a current sensor that uses Hall effect elements.

TMR elements are known to have a higher sensitivity than GMR elements, but at the expense of higher noise at low frequencies.

Magnetic field sensing elements used in a magnetic field sensor, e.g., a current sensor that senses a local magnetic field generated by a current conductor, can be influenced not only by the local magnetic field that is desirable to measure, but also by an undesirable stray magnetic field that can be external to the magnetic field sensor, and which can come from any direction. Techniques, such as differential sensing, can be used to mitigate errors caused by the stray magnetic field. However, some influence of the stray magnetic field may still remain.

Thus, it would be desirable to provide a magnetic field sensor that can measure a stray magnetic field and, in some embodiments, compensate for the influence of the stray magnetic field upon the magnetic field sensor.

SUMMARY

The present invention provides a magnetic field sensor that can measure a stray magnetic field and, in some embodiments, compensate for the influence of the stray magnetic field upon the magnetic field sensor.

In accordance with an example useful for understanding an aspect of the present invention, a magnetic field sensor can include a substrate having a major surface in an x-y plane with an x axis and a y axis. The magnetic field sensor can also have an external field sensing circuit disposed upon the substrate and responsive to an external magnetic field generated outside of the magnetic field sensor. The external field sensing circuit can include one or more magnetoresistance elements each having a respective reference layer with a magnetic direction parallel to the y axis and in the x-y plane. The one or more magnetoresistance elements can be operable to generate a magnetoresistance element signal responsive to the external magnetic field. The external field sensing circuit can also include a component determination module coupled to receive the magnetoresistance element signal and operable to generate a measured x-dominant value and a measured y-dominant value, wherein the measured x-dominant value is indicative of an x component and a y component of the external magnetic field projected onto the x-y plane, wherein the measured x-dominant value more indicative of the x component and less indicative of the y component, wherein the measured y-dominant value is indicative of the x component and the y component, wherein the measured y-dominant value is more indicative of the y component and less indicative of the x component.

In accordance with another example useful for understanding another aspect of the present invention, a method in a magnetic field sensor can include generating, with one or more magnetoresistance elements disposed upon a substrate having a major surface in an x-y plane with an x axis and a y axis, a magnetoresistance element signal responsive to an external magnetic field generated outside of the magnetic field sensor, wherein the one or more magnetoresistance elements each have a respective reference layer with a magnetic direction parallel to the y axis and in the x-y plane. The method can also include generating a measured x-dominant value and a measured y-dominant value, wherein the measured x-dominant value is indicative of an x component and a y component of the external magnetic field projected onto the x-y plane, wherein the measured x-dominant value more indicative of the x component and less indicative of the y component, wherein the measured y-dominant value is indicative of the x component and the y component, wherein the measured y-dominant value is more indicative of the y component and less indicative of the x component.

BRIEF DESCRIPTION OF THE DRAWINGS

The foregoing features of the invention, as well as the invention itself may be more fully understood from the following detailed description of the drawings, in which:

FIG. 5 is a block diagram showing a current sensor having the four TMR elements and the current conductor of FIG. 1, and also showing a substrate proximate to the current conductor;

FIG. 6 is a schematic diagram showing two TMR elements or two GMR elements coupled to a differential amplifier to generate a difference signal;

FIG. 7 is a schematic diagram showing four TMR elements or four GMR elements coupled in a bridge arrangement to generate a difference signal;

FIG. 12 is a block diagram showing four GMR elements disposed proximate to a current conductor, showing a single GMR element disposed apart from the current conductor, and showing a magnetic field generator proximate to the single GMR element for generating an AC magnetic field between top and bottom on the page and parallel to a reference direction of the single GMR element;

FIG. 12A is a block diagram showing the four GMR elements of FIG. 12 arranged in a bridge to generate a differential output voltage;

FIG. 12B is a block diagram showing the single GMR element of FIG. 13 driven by a current generator;

FIG. 13 is a block diagram showing four GMR elements disposed proximate to a current conductor, showing a single GMR element disposed apart from the current conductor, and showing a first magnetic field generator proximate to the single GMR element for generating an AC magnetic field between top and bottom on the page and parallel to a reference direction of the single GMR element and also showing a second magnetic field generator for generating an AC magnetic field between right and left on the page and perpendicular to a reference direction of the single GMR;

FIG. 13A is a block diagram showing the four GMR elements of FIG. 13 arranged in a bridge to generate a differential output voltage;

FIG. 13B is a block diagram showing the single GMR element of FIG. 13 driven by a current generator;

FIG. 14 is a block diagram showing four TMR elements, each having a plurality of TMR pillars, disposed proximate to a current conductor, showing a single TMR element having a plurality of TMR pillars, disposed apart from the current conductor, and showing a magnetic field generator proximate to the single TMR element for generating four AC magnetic fields between top and bottom on the page and parallel to a reference direction of the single TMR element;

FIG. 14A is a block diagram showing the four TMR elements of FIG. 14 arranged in a bridge to generate a differential output voltage;

FIG. 14B is a block diagram showing the single TMR element of FIG. 14 driven by a current generator;

FIG. 15 is a block diagram showing four TMR elements disposed proximate to a current conductor, each having a plurality of TMR pillars, showing a single TMR element having a plurality of TMR pillars, disposed apart from the current conductor, showing four magnetic field generators proximate to the single TMR element for generating four AC magnetic fields between top and bottom on the page and parallel to a reference direction of the single TMR element, and also showing one magnetic field generator proximate to the single TMR element for generating an AC magnetic field right to left on the page and perpendicular to the reference direction of the signal TMR element;

FIG. 15A is a block diagram showing the four TMR elements of FIG. 15 arranged in a bridge to generate a differential output voltage;

FIG. 15B is a block diagram showing the single TMR element of FIG. 15 driven by a current generator;

DETAILED DESCRIPTION

Figures 1, 2:
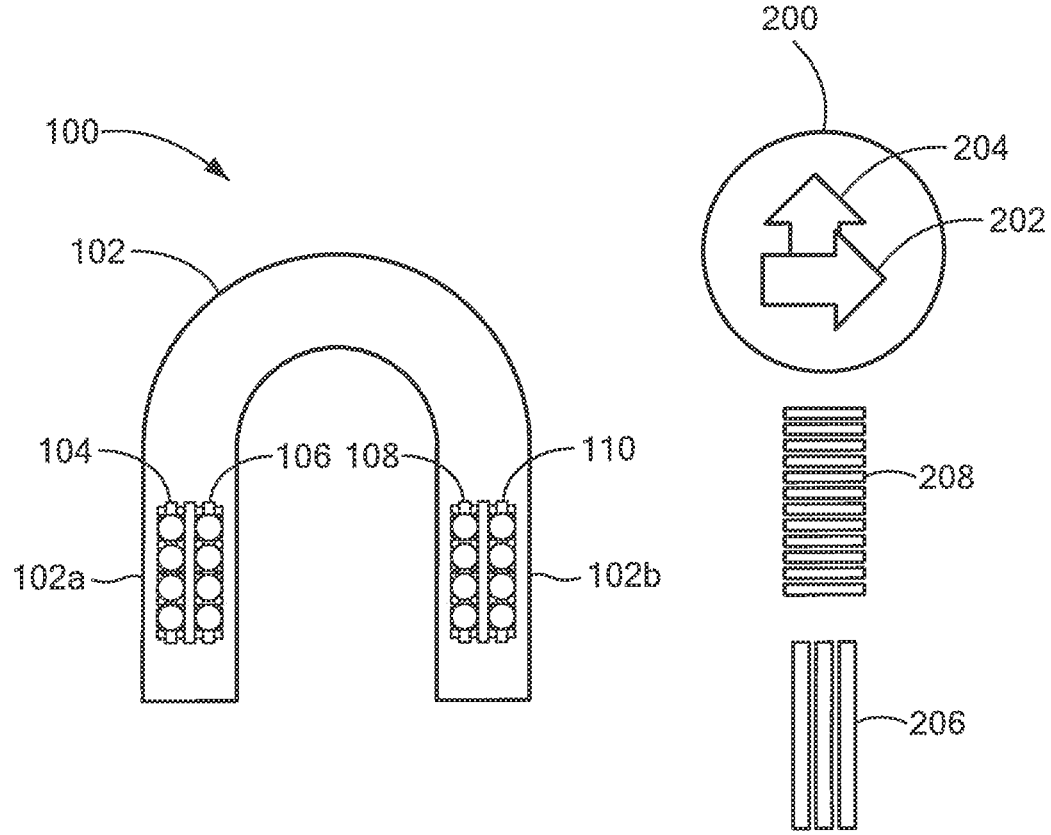
FIG. 1 is a block diagram showing four TMR elements, each with a plurality of TMR pillars (e.g., four pillars), proximate to a current conductor.
FIG. 2 is a block diagram showing one TMR pillar, two coils, and magnetic field directions associated with the two coils.

Before describing the present invention, it should be noted that reference is sometimes made herein to GMR or TMR elements having particular shapes (e.g., yoke shaped or pillar shaped). One of ordinary skill in the art will appreciate, however, that the techniques described herein are applicable to a variety of sizes and shapes.

As used herein, the term "anisotropy" or "anisotropic" refer to a material that has different properties according to direction in the material. A magnetoresistance element can have a particular axis or direction to which the magnetization of a ferromagnetic or ferrimagnetic layer tends to orientate when it does not experience an additional, external, magnetic field. An axial anisotropy can be created by a crystalline effect or by a shape anisotropy, both of which can allow two equivalent directions of magnetic fields. A directional anisotropy can also be created in an adjacent layer, for example, by an antiferromagnetic layer, which allows only a single magnetic field direction along a specific axis in the adjacent layer.

In view of the above, it will be understood that introduction of an anisotropy in a magnetic layer results in forcing the magnetization of the magnetic layer to be parallel to that anisotropy in the absence of an external field. In the case of a GMR or TMR element, a directional anisotropy provides an ability to obtain a coherent rotation of the magnetization in a magnetic layer in response, for example, to an external magnetic field, which has the property of suppressing the hysteresis behavior of the corresponding element.

As described above, as used herein, the term "magnetic field sensing element" is used to describe a variety of different types of electronic elements that can sense a magnetic field. A magnetoresistance element is but one type of magnetic field sensing element.

As is known, there are different types of magnetoresistance elements, for example, a semiconductor magnetoresistance element such as a giant magnetoresistance (GMR) element and a tunneling magnetoresistance (TMR) element, also called a magnetic tunnel junction (MTJ) element. Metal based or metallic magnetoresistance elements (e.g., GMR, TMR, AMR) and tend to have axes of maximum sensitivity parallel to a substrate. However, some TMR elements can have an axis of maximum sensitivity perpendicular to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

The terms "parallel" and "perpendicular" may be used in various contexts herein. It should be understood that the terms parallel and perpendicular do not require exact perpendicularity or exact parallelism, but instead it is intended that normal manufacturing tolerances apply, which tolerances depend upon the context in which the terms are used.

In some instances, the term "substantially" is used to modify the terms "parallel" or "perpendicular." In general, use of the terms "substantially" and the term "about" reflect angles that are within manufacturing tolerances, for example, within +/−ten degrees.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe an electronic component that has at least one p-n junction. A transistor, a diode, and a logic gate are examples of active electronic components. In contrast, as used herein, the term "passive electronic component" as used to describe an electronic component that does not have at least one p-n junction. A capacitor and a resistor are examples of passive electronic components.

As used herein, the term "amplifier" is used to describe a circuit element with a gain greater than one, less than one, or equal to one.

As used herein, the terms "line" and "linear" are used to describe either a straight line or a curved line. The line can be described by a function having any order less than infinite.

Structures and methods described herein apply to both GMR and TMR magnetoresistance elements, but, only TMR elements are used in some examples herein. However, it should be appreciated that the same or similar structures and methods can apply to other spin electronics magnetoresistance elements, either now known or later discovered. This includes, in particular, oxide-based spin electronics structures.

FIGS. 1-10 herein describe a current sensor described in-part in U.S. patent application Ser. No. 15/869,620, filed Jan. 12, 2018, and also described in U.S. patent application Ser. No. 15/895,418, filed Feb. 13, 2018, both of which are assigned to the assignee of the present invention and both of which are incorporated by reference herein in their entirety.

FIGS. 11-30 described a stray field measuring circuit. Some of the figures describe the stray field measuring circuit used in combination with the current sensor of FIGS. 1-10. However, it should be appreciated that the stray field measuring circuit can be used in conjunction with any form of magnetic field sensor and can even be used by itself to merely measure an external field received from outside of the magnetic field sensor.

Referring now to FIG. 1, a structure 100, which can be part of a current sensor described below in conjunction with FIG. 5, can include a current conductor 102 having two portions 102a, 102b. The current conductor can be formed as an open loop for which current travels in two different directions. The structure 100 can also include four TMR elements 104, 106, 108, 110. Each TMR element can be comprised of a plurality of so-called "pillars." Four pillars are shown for each one of the TMR elements 104, 106, 108, 110. However, in other embodiments each TMR element can include a different number of pillars, fewer than or greater than four pillars. In some embodiments, each TMR element has approximately thirty pillars.

Referring now to FIG. 2, shown under the TMR elements 104, 106, 108, 110 of FIG. 1, the structure 100 can include four coils, here expanded as two coils 206, 208.

A pillar 200 can be the same as or similar to one of the pillars of the TMR elements 104, 106, 108, 110. It should be understood that the coil 206 can generate a magnetic field with the direction indicated by an arrow 202, and the coil 208 can generate a magnetic field with a direction indicated by an arrow 204. The coils and the magnetic directions are described more fully in figures below.

Figure 3:
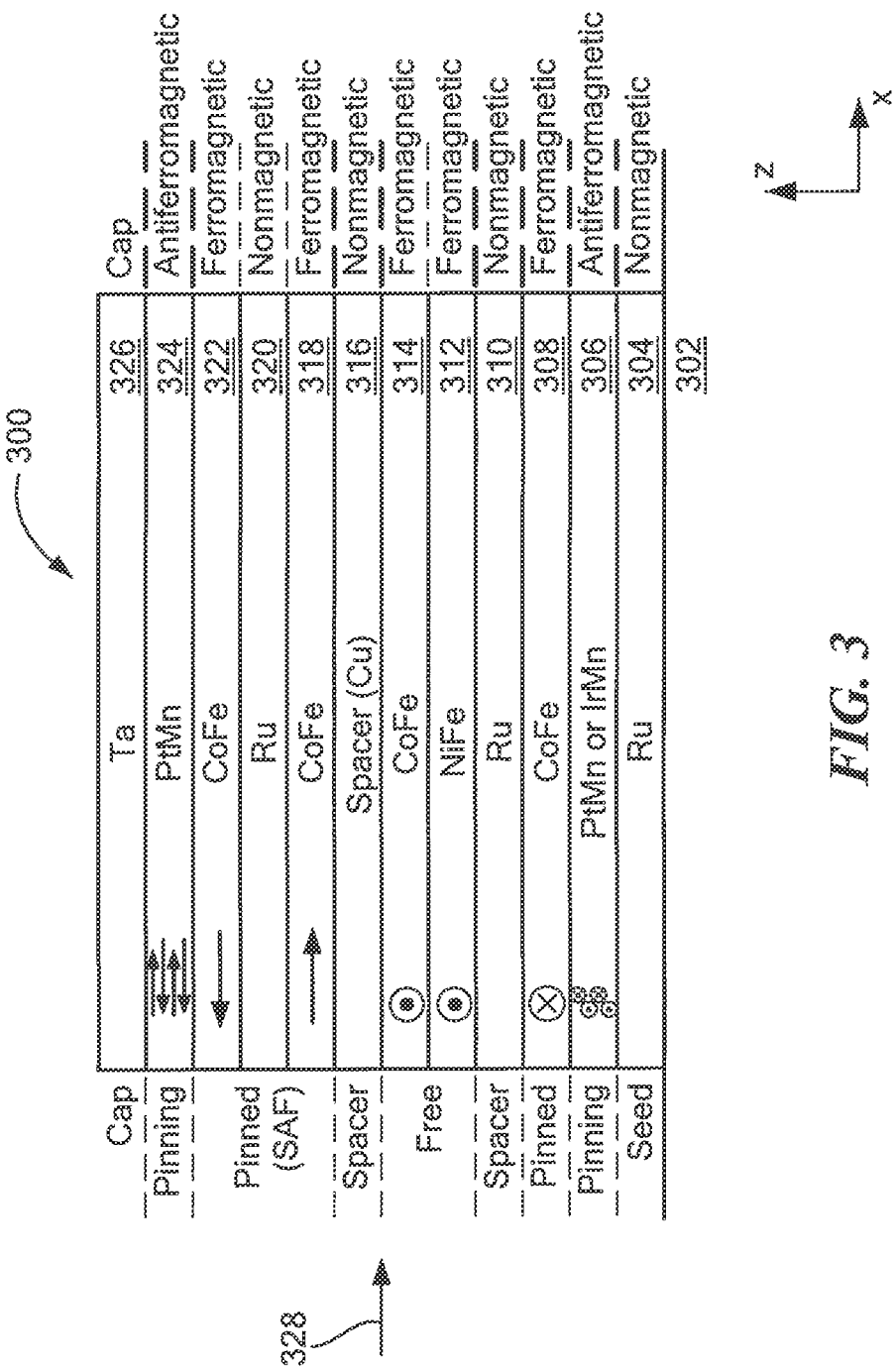
FIG. 3 is a block diagram showing an illustrative double pinned GMR element having layers.
Figure 3A:
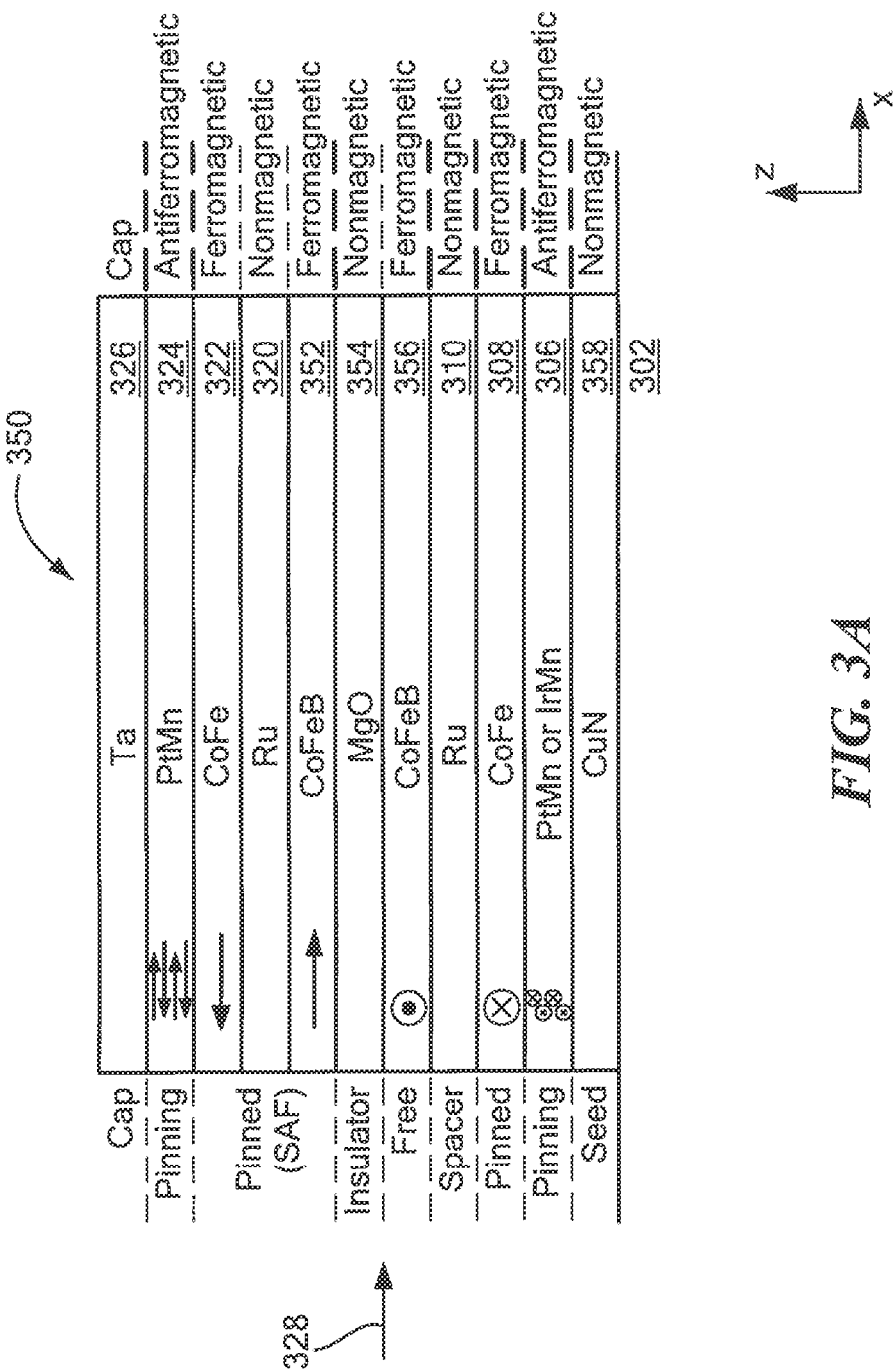
FIG. 3A is a block diagram showing an illustrative double pinned TMR element having layers.

FIGS. 3 and 3A describe illustrative GMR and TMR elements, respectively. It will be understood that TMR elements are used in various descriptions herein. However, GMR elements can be used in place of the TMR elements.

Referring now to FIG. 3, an illustrative double pinned GMR element 300 can be comprised of a stack of layers 304-326 disposed upon a surface of a substrate 302.

It will be understood that driving current can run across the layers of a GMR stack of layers, i.e., parallel to the surface of the substrate 302. However, in some embodiments, the driving current can run through the layers in a direction perpendicular to the substrate 302. The GMR element 300 can have a maximum response axis that is parallel to the surface of the substrate and that is in a direction 328 perpendicular to zero field magnetic directions of the free layers 312, 314, and also parallel to the field generated by the reference layers, most notably the pinned layer 318.

The GMR element 300 is double pinned, i.e., it has two pinning layers 306, 324. A synthetic antiferromagnet (SAF) pinned layer structure 318, 320, 322 is magnetically coupled to the pinning layer 324. The layers 324, 322, 320, 318 are collectively referring to as reference layers. The single layer pinned layer 308 is magnetically coupled to the pinning layer 306. The layers 306, 308 are collectively referred to bias layers. At zero external magnetic field, the free layers 312, 314 take on a magnetic alignment parallel to the bias layers 306, 308, with direction (ferromagnetic or antiferromagnetic coupling) determined by thickness and material of the spacer layer 310.

Single pinned arrangements are also possible with one pinning layers and one pinned layer. Advantages of double pinned versus double pinned arrangement are known.

In some embodiments, the single layer pinned layer 308 is replaced by another SAF structure. In still other embodiments, the SAF structure 318, 320, 322 is replaced by a single layer pinned layer.

As described above, in general, the GMR element 300 has a maximum response axis (maximum response to external fields) aligned with the arrow 328, i.e., perpendicular to bias directions experienced by the free layers 312, 314, and parallel to magnetic fields of the reference layers, notably pinned layer 318. Also, in general, it is rotations of the magnetic direction of the free layers 312, 314, caused by external magnetic fields that result in changes of resistance of the GMR stack 300.

A conventional current sensor may directly sense magnetic fields that are in the direction of the arrow 328, which are generated by sensed currents (which are not the above mentioned-currents that drive the GMR element 300). However, it will become apparent from discussion below that, for embodiments herein, the sensed current generates external magnetic fields either into or out of the page, i.e., parallel to magnetic fields of the free layers 312, 314 and parallel to magnetic fields of the bias layers 306, 308. Magnetic fields in these directions due to sensed current (i.e., external magnetic fields) tend to increase or decrease a sensitivity of the GMR element 300, sensitivity along the direction 328. Essentially, the external magnetic fields parallel to the magnetic fields of the bias layers 306, 308 tend to add to or subtract from fields in this direction experience by the free layers 312, 314. It will become apparent that the sensitivity shift is sensed by circuits and techniques herein, and thus, it is the sensitivity shift that represents the sensed current.

Referring now to FIG. 3A, in which like elements of FIG. 3 are shown having like reference designations, an illustrative TMR element 350 can have a stack 350 of layers 358, 306-310, 356, 354, 352, 320-326 indicative of one pillar of a multi-pillar TMR element.

It will be understood that a driving current running through the TMR element 350 runs through all of the layers of the stack, running between seed and cap layers 358 and 326, i.e., perpendicular to a surface of the substrate 302. The TMR element 350 can have a maximum response axis that is parallel to the surface of the substrate and that is in the direction 328 perpendicular to zero field magnetic directions of the free layer 356, and also parallel to the bias field generated by the reference layers, most notably in the pinned layer 352.

The TMR element 350 is double pinned, i.e., it has two pinning layers 306, 324. A synthetic antiferromagnet (SAF) pinned layer structure 352, 320, 322 is magnetically coupled to the pinning layer 324. The layers 324, 322, 320, 352 are collectively referring to as reference layers. The single layer pinned layer 308 is magnetically coupled to the pinning layer 306. The layers 306, 308 are collectively referred to as bias layers. With zero external magnetic field, the free layer 356 takes on a magnetic alignment parallel to the bias layers 306, 308, with direction (ferromagnetic or antiferromagnetic coupling) determined by thickness and material of the spacer layer 310.

In some embodiments, the single layer pinned layer 308 is replaced by another SAF structure. In still other embodiments, the SAF structure 352, 320, 322 is replaced by a single layer pinned layer.

As described above, in general, the TMR element 350 has a maximum response axis (maximum response to external fields) aligned with the arrow 328, i.e., perpendicular to bias directions experienced by the free layer 356, and parallel to magnetic fields of the reference layers, notably pinned layers 352. Also, in general, it is rotations of the magnetic direction of the free layer 356 caused by external magnetic fields that result in changes of resistance of the TMR element 350.

A conventional current sensor may directly sense magnetic fields that are in the direction of the arrow 328, which are generated by sensed currents (which are not the above mentioned-currents that drive the TMR element 350). However, it will become apparent from discussion below that, for embodiments herein, the sensed current generates external magnetic fields either into or out of the page, i.e., parallel to magnetic fields of the free layer 356 and parallel to magnetic fields of the bias layers 306, 308. Magnetic fields in these directions due to sensed current (i.e., external magnetic field) tend to increase or decrease a sensitivity of the TMR element 300 along the direction 328. Essentially, the external magnetic fields parallel to the magnetic fields of the bias layers 306, 308 tend to add to or subtract from fields in this direction experienced by the free layer 356. It will become apparent that the sensitivity shift is sensed by circuits and techniques herein, and thus, it is the sensitivity shift that represents the sensed current.

Figure 4:
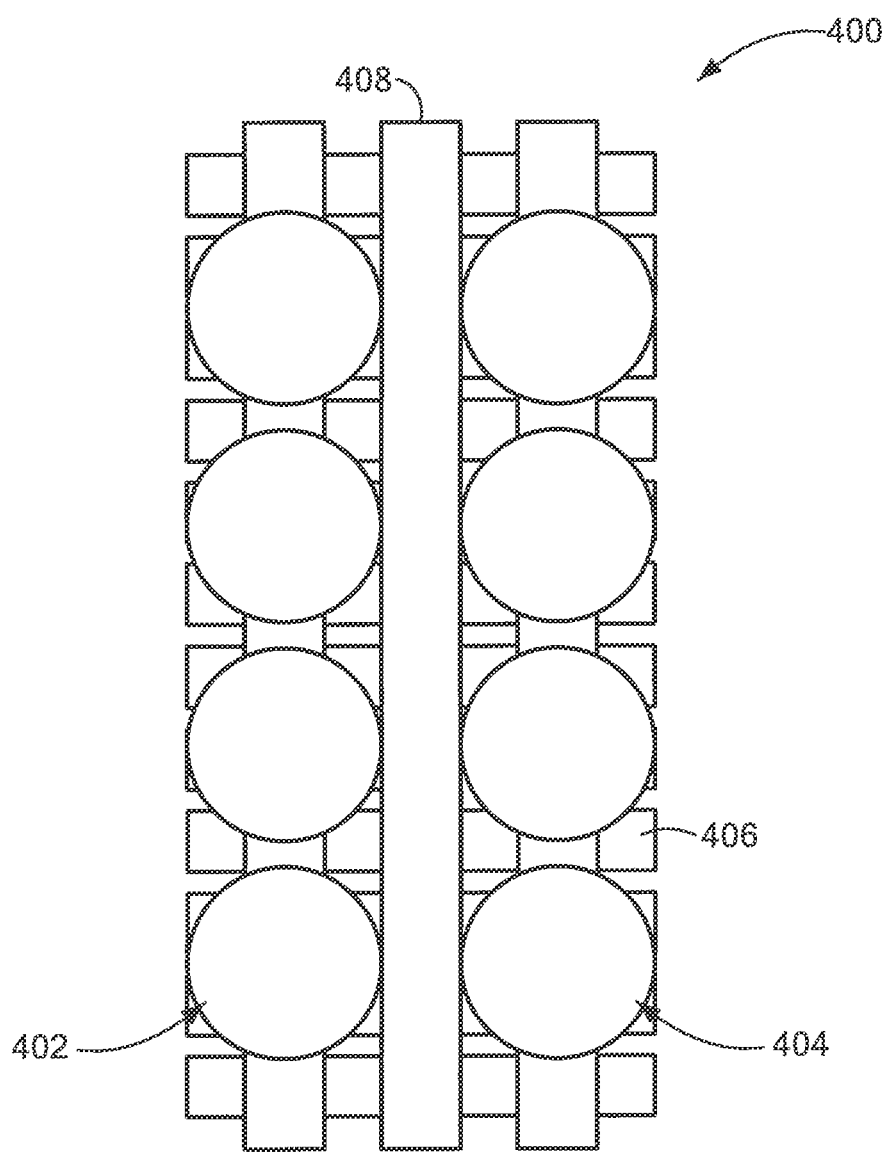
FIG. 4 is a block diagram showing an expanded view of two of the four TMR elements of FIG. 1 and showing positions of the two coils of FIG. 2.

Referring to FIG. 4, illustrative TMR elements 400 include a first TMR element 402 and a second TMR element 404. Each one of the TMR elements includes a respective four TMR pillars that extend upward from a surface of a substrate on which the TMR elements 402, 404 are formed. As described above, a TMR element can have more than four or fewer than four pillars. The TMR elements 400 are the same as TMR elements 104, 106 or TMR elements 108, 110 of FIG. 1, but here shown in expanded form to better show the coils 406, 408, which can be the same as or similar to the coils 208, 206 of FIG. 2.

In non-feedback arrangements, the feedback coils 408 are not formed.

It will be understood that, when an AC current is applied to the perturbing coil 406, a perturbing magnetic field is generated in a direction parallel to the page and oriented between top and bottom on the page. In contrast, when an AC or DC current is applied to the feedback coil 408, a feedback magnetic field is generated in a direction parallel to the page and oriented between right and left on the page.

Referring again briefly to FIG. 3A, the TMR element 350 is shown in side view, but the TMR elements 402, 404 are shown in top view. The TMR element pillars are oriented such that the maximum response axis 328 is parallel to the perturbing magnetic fields generated by the perturbing coil 406, i.e., between right and left on the page of FIG. 3A but between top and bottom on the page of FIG. 4. Accordingly, the TMR element pillars can be oriented such that the maximum response axis 328 is perpendicular to the current conductor (external) magnetic fields generated by the sensed currents 501 of FIG. 5. Also, the TMR element pillars can be oriented such that magnetic directions of the reference layers of the TMR element 350 are perpendicular to the current conductor magnetic fields generated by the sensed currents.

With this orientation of the TMR element pillars, the TMR element pillars are also oriented such that a direction of bias magnetic fields in the bias layers 306, 308 is parallel to a feedback magnetic field generated by the feedback coil 408, i.e., into and out of the page on FIG. 3A, but between right and left on the page of FIG. 4, which is also parallel to, but opposing, sensed magnetic fields generated by the sensed current.

Referring again briefly to FIG. 4, when feedback is used, fields generated by the feedback coil 408 are used to oppose (and are parallel to) fields resulting from sensed current in the current conductor 102 of FIG. 1, which are also parallel to fields in the bias layers 306, 308 of FIG. 3A.

From the above, it should be understood that, for a circuit with no feedback and no feedback coils 408, sensed magnetic fields resulting from sensed currents result in sensitivity shifts of the TMR elements 400 and the sensed magnetic fields are not directly sensed. For a circuit with feedback, the feedback coil 408 can generate a feedback magnetic field that fully opposes the sensed magnetic field generated by the sensed currents in a current conductor. The feedback coil arrangement can result in no sensitivity shift at the TMR elements 400. However, current in the feedback coil 408 can be indicative of a sensitivity shift that would have occurred were it not for the feedback arrangement and the feedback coil 408. The current in the feedback coils can be indicative of the sensitivity shift that would have occurred.

Advantages of feedback arrangements include, but are not limited to, and ability to keep the TMR or GMR element operating at a near zero magnetic field, i.e., within a linear region of a transfer characteristic of the TMR or GMR element. Thus, nonlinearity of the measurement of the sensed magnetic field and sensed current can be greatly reduced versus a non-feedback arrangement.

Advantages of using the sensitivity shifts as that which are sensed by the sensed current and resulting sensed magnetic field are described in conjunction with figures below.

Referring now to FIG. 5, a magnetic field sensor 500 can include four TMR elements 504, 506, 508, 510 disposed upon a substrate 510 along with an electronic circuit 512.

The magnetic field sensor can also include a current conductor 502 through which a sensed current 501, Ip+, Ip– that the magnetic field sensor 500 is operable to measure, can flow. To avoid confusion herein, the sensed current 501 is described herein to be a DC sensed current. However, the same techniques apply to an AC measure current.

As indicated, because the current conductor 502 is an open loop, the current 501 flows in two different directions Ip–, Ip+. The current conductor 502 has two current conductor portions 502a, 502b. Thus, the current 501 results in two different direction magnetic fields represented by arrows 503a, 503b.

It should be understood from discussion above that maximum response axes of the four TMR element 504, 506, 508, 510 are parallel to the long axis of the TMR elements, i.e., between top and bottom of the page, and are all in the same direction. Along this same axis, perturbing magnetic fields generated by perturbing coils, e.g., 406 of FIG. 4, are generated.

Also, the fields in the bias layers e.g., 306, 308 of FIG. 3A, are aligned between right and left on the page of FIG. 5 and all have the same direction. Thus, the sensed current magnetic fields 503a, 503b are aligned with the bias magnetic fields (between right and left) and not with the maximum response axis (between top and bottom). Since the sensed magnetic fields 503a, 503b are in opposite directions, sensitivity of two of the TMR elements, e.g., 504, 506, moves in one direction, e.g., increases, and sensitivity of the other two TMR elements, e.g., 508, 510, moves in the other direction, e.g., decreases.

In some embodiments, the current conductor 502 can be part of a lead frame of the magnetic field sensor 500, which can terminate at two of a plurality of leads in the lead frame. In other embodiments, the current conductor 502 is not part of the magnetic field sensor, but is instead a separate conductor, for example, a current conductor on a circuit board to which the magnetic field sensor 500 is mounted.

The TMR elements 504, 506 are labeled as left, L, and the TMR elements 508, 510 are labeled right, R. The left and right designations are arbitrary and are used to indicate that the TMR elements 504, 506 experience the magnetic field 503a that is in a different direction from the magnetic field 503b experience by the TMR elements 508, 510. However, for convenience, left and right also indicate left and right sides of FIG. 5. The different directions result from the two different directions in which the sensed current 501 flows in the current conductor 502.

While the four TMR elements 504, 506, 508, 510 are shown, in other embodiments, there can be two TMR elements, one disposed on the left and one disposed on the right. In other embodiments, there can be more than four TMR elements, with half on the left and half on the right.

Referring now to FIG. 6, an electronic circuit 600, used in illustrative magnetic field sensors described in conjunction with figures below, can include first and second magnetoresistance elements 602, 604, e.g., TMR elements. The magnetoresistance element 602 can receive a driving current from a current source 606. The magnetoresistance element 604 can receive a driving current from a current source 608.

Voltages 602a, 604a are generated by the first and second magnetoresistance elements 602, 604, respectively, which are responsive to magnetic fields.

A differential amplifier 610 is coupled to the first and second magnetoresistance elements 602, 604. The differential amplifier 610 is operable to generate a voltage 610a that is a difference (U=L−R) of the voltages 602a, 604a. Reasons for the difference are described in conjunction with figures below.

It should be understood that circuits described in conjunction with figures below can instead generate a difference R−L, with minor modifications.

Referring now to FIG. 7, an electronic circuit 700, used in illustrative magnetic field sensors described in conjunction with figures below, can include first, second, third, and fourth magnetoresistance elements 702, 704, 706, 708, e.g., TMR elements arranged in a full bridge arrangement. The full bridge arrangement can be coupled between a voltage source 710 and a reference voltage, e.g., a ground voltage.

Voltages 700a, 700b are generated by the full bridge, both of which are responsive to magnetic fields. A difference between the voltages 700a, 700b is automatically generated by the full bridge arrangement.

A differential amplifier 712 can be coupled to the full bridge arrangement. The differential amplifier 712 is operable to generate a difference signal 712a that is also a difference of the voltages 700a, 700b. Reasons for the difference are described in conjunction with figures below.

Figure 8:
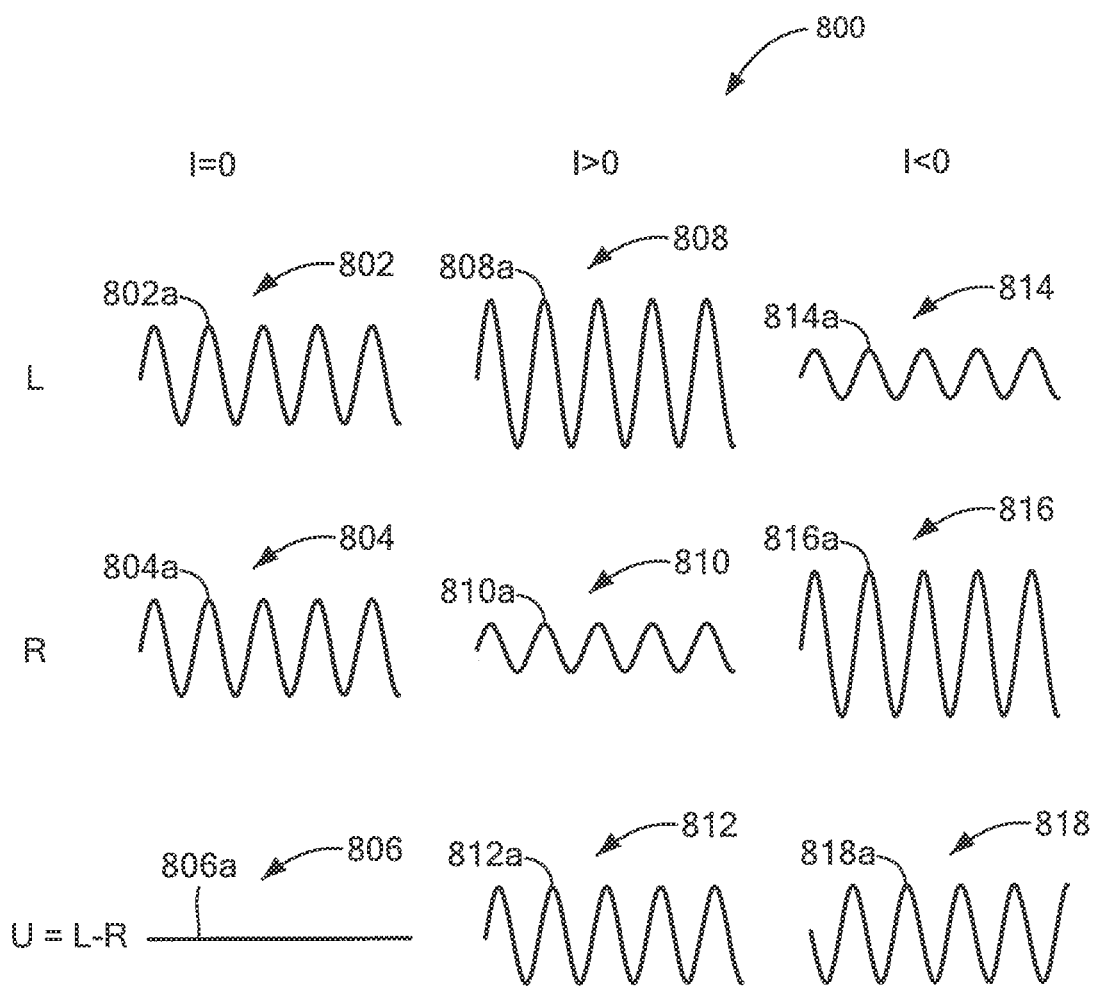
FIG. 8 is a graph showing a variety of signals that can be generated by a current sensor having the arrangement of FIGS. 5-7.

Referring now to FIG. 8, graphs 800 have vertical ranges in amplitude, for example, volts in arbitrary units, and horizontal ranges in time in arbitrary units.

For clarity, the graphs 800 use sensed currents, e.g., the sensed current 501 of FIG. 5, as being DC currents, in particular, I=0, I>0, and I<0. However, here and in circuits described below, it will be understood that the sensed currents can be AC currents.

Graph 802 is indicative of an AC signal 802a generated by the left magnetoresistance element(s), e.g., one of, or both of, the magnetoresistance elements 504, 506 of FIG. 5, when the sensed current, e.g., 501 of FIG. 5, is zero. The AC part of the signal is a result of the perturbing magnetic field described above in conjunction with FIG. 4, generated by the coil 406, which, as described above, can be aligned with a maximum response axis of the left magnetoresistance element(s). The perturbing magnetic field can have a constant amplitude. In some embodiments, the perturbing magnetic field, and the resulting AC signal 802a can have a high frequency, e.g., one megaHertz.

Graph 804 is indicative of an AC signal 804a generated by the right magnetoresistance element(s), e.g., one of or both of the magnetoresistance elements 508, 510 of FIG. 5, when the sensed current, e.g., 501 of FIG. 5, is zero. The AC part of the signal is a result of the perturbing magnetic field also described above in conjunction with FIG. 4, generated by the coil 406, which, as described above, can be aligned with a maximum response axis of the right magnetoresistance element(s).

Graph 806 shows a signal 806a indicative of a difference between the AC signals 802a, 804a. Thus, for a zero sensed current, I, the difference is the signal 806a with an AC amplitude of zero.

Graph 808 is indicative of an AC signal 808a generated by the left magnetoresistance element(s), e.g., one of or both of the magnetoresistance elements 504, 506 of FIG. 5, in response to the perturbing magnetic field(s) generated by the perturbing coils(s), when the sensed current, e.g., 501 of FIG. 5, is greater than zero. The AC part of the signal 808a is a result of the perturbing magnetic field described above in conjunction with FIG. 4, generated by perturbing coils proximate to the left magnetoresistance element(s), e.g., 406, which, as described above, can be parallel to a maximum response axis of the left magnetoresistance element(s). The signal 808a is greater in amplitude than the signal 802a due to an effect of the magnetic field generated by the non-zero sensed current, e.g., the magnetic field 503a generated by the measure current 501 of FIG. 5.

As described above in conjunction with FIG. 4, the magnetic field generated by the sensed current, in a direction parallel to magnetic fields in the bias layers 306, 308 of FIG. 4, has the effect of changing a sensitivity of the left magnetoresistance element(s), here shown to be an increase of sensitivity. Thus, the magnetic field generated by the sensed current 501 has an indirect influence upon the signal 808a.

Graph 810 is indicative of an AC signal 810a generated by the right magnetoresistance element(s), e.g., one of or both of the magnetoresistance elements 508, 510 of FIG. 5, in response to the perturbing magnetic field(s) generated by the perturbing coils(s), when the sensed current, e.g., 501 of FIG. 5, is greater than zero. The AC part of the signal 810a is a result of the perturbing magnetic field described above in conjunction with FIG. 4, generated by perturbing coils proximate to the right magnetoresistance element(s), e.g., 406, which, as described above, can be parallel to a maximum response axis of the right magnetoresistance element(s). The signal 810a is lower in amplitude than the signal 804a due to an effect of the magnetic field generated by the non-zero sensed current, e.g., the magnetic field 503b generated by the sensed current 501 of FIG. 5, and which is in a direction opposite to the magnetic field 503a.

As described above in conjunction with FIG. 4, the magnetic field generated by the sensed current, in a direction parallel to magnetic fields in the bias layers 306, 308 of FIG. 4, has the effect of changing a sensitivity of the left magnetoresistance element(s), here shown to be a decrease of sensitivity. Thus, the magnetic field generated by the sensed current 501 has an indirect influence upon the signal 810a.

Graph 812 shows a signal 812a indicative of a difference between the AC signals 808a, 810a. Thus, for a sensed current, I, greater than zero, the difference is the signal 812a with a non-zero AC amplitude. Amplitude of the signal 812a is indicative of an amplitude of the sensed current 501. Phase of the signal 812a is indicative of a direction of the sensed current 501.

Graph 814 is indicative of an AC signal 814a generated by the left magnetoresistance element(s), e.g., one of or both of the magnetoresistance elements 504, 506 of FIG. 5, in response to the perturbing magnetic field(s) generated by the perturbing coils(s), when the sensed current, e.g., 501 of FIG. 5, is less than zero. The AC part of the signal 814a is a result of the perturbing magnetic field described above in conjunction with FIG. 4, generated by perturbing coils proximate to the left magnetoresistance element(s), e.g., 406, which, as described above, can be parallel to a maximum response axis of the left magnetoresistance element(s). The signal 814a is smaller in amplitude than the signal 802a due to an effect of the magnetic field generated by the non-zero sensed current, e.g., the magnetic field 503a generated by the measure current 501 of FIG. 5, but now reversed versus field 503b.

As described above in conjunction with FIG. 4, the magnetic field generated by the sensed current, in a direction parallel to magnetic fields in the bias layers 306, 308 of FIG. 4, has the effect of changing a sensitivity of the left magnetoresistance element(s), here shown to be a decrease of sensitivity. Thus, the magnetic field generated by the sensed current 501 has an indirect influence upon the signal 814a.

Graph 816 is indicative of an AC signal 816a generated by the right magnetoresistance element(s), e.g., one of or both of the magnetoresistance elements 508, 510 of FIG. 5, in response to the perturbing magnetic field(s) generated by the perturbing coils(s), when the sensed current, e.g., 501 of FIG. 5, is lesser than zero. The AC part of the signal 816a is a result of the perturbing magnetic field described above in conjunction with FIG. 4, generated by perturbing coils proximate to the right magnetoresistance element(s), e.g., 406, which, as described above, can be parallel to a maximum response axis of the right magnetoresistance element(s). The signal 816a is higher in amplitude than the signal 804a due to an effect of the magnetic field generated by the non-zero sensed current, e.g., the magnetic field 503b generated by the sensed current 501 of FIG. 5, and which is in a direction aligned with the magnetic field 503a.

As described above in conjunction with FIG. 4, the magnetic field generated by the sensed current, in a direction parallel to magnetic fields in the bias layers 306, 308 of FIG. 4, has the effect of changing a sensitivity of the left magnetoresistance element(s), here shown to be a decrease of sensitivity. Thus, the magnetic field generated by the sensed current 501 has an indirect influence upon the signal 814a.

Graph 818 shows a signal 818a indicative of a difference between the AC signals 812a, 812b. Thus, for a sensed current, I, less than zero, the difference is the signal 818a with a non-zero AC amplitude. Amplitude of the signal 818a is indicative of an amplitude of the sensed current 501. Phase of the signal 818a is indicative of a direction of the sensed current 501. The signal 818a (and 816a, 814a) is opposite in phase from (one hundred eighty degrees apart from) the signal 812a, which is indicative of the different directions of the sensed current.

As described above, the graphs 800 are indicative of DC sensed magnetic fields, e.g., 503a, 503b of FIG. 5, generated by a DC current, e.g., 501 of FIG. 5. However, the same techniques apply to AC sensed magnetic fields generated by and AC sensed current. To this end, it will be understood that preferably, the AC sensed current has a frequency or bandwidth less than a frequency of the perturbing magnetic fields, e.g., frequency of the signals in the graphs 800. In some embodiments, the frequency or bandwidth of the AC sensed current is less than one half of the frequency of the perturbing magnetic fields. In some embodiments, the frequency or bandwidth of the AC sensed current is less than one fifth or less than one tenth of the frequency of the perturbing magnetic fields.

Figure 9:
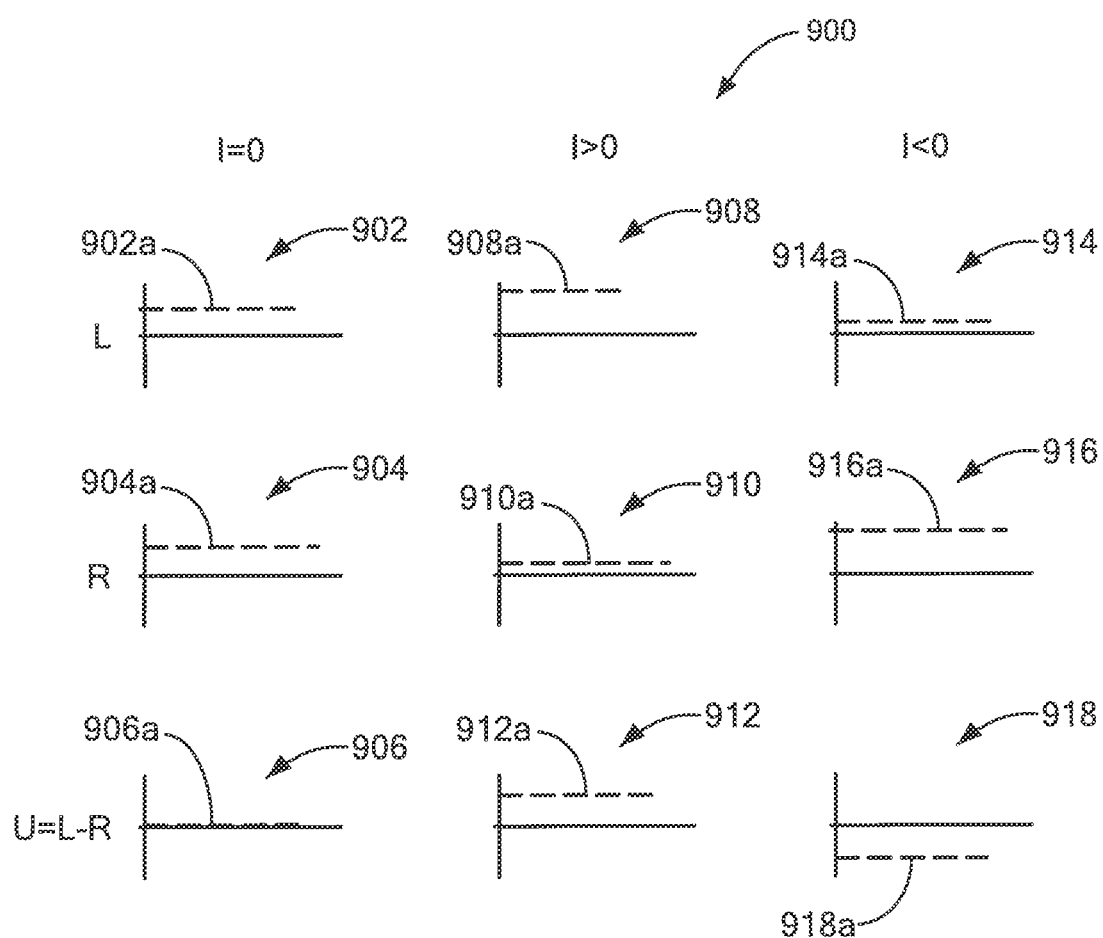
FIG. 9 is a graph showing a variety of signals generated by a current sensor having the arrangement of FIG. 5-7 and having an amplitude detector resulting in amplitudes of the signals of FIG. 8.

Referring now to FIG. 9, and referring back to FIG. 8, graphs 900 show DC signals 902a, 904a, 906a, 908a, 910a, 912a, 914a, 916a, 918a that are indicative of AC amplitudes of the signals 802a, 804a, 806a, 808a, 810a, 812a, 814a, 816a, 818a, respectively. The signal 918a is shown as a negative amplitude, which is indicative of the signal 818a being one hundred eighty degrees out of phase from the other signals. Compare signals 912a and 918a and also signals 812a and 818a. The signal 918a with an opposite sign is an outcome of the signal 918a being a difference of signals 914a and 916a.

Reasons for the signals 902a, 904a, 906a, 908a, 910a, 912a, 914a, 916a, 918a indicative of amplitudes will become apparent in figures below that describe amplitude detecting circuits.

Figure 10:
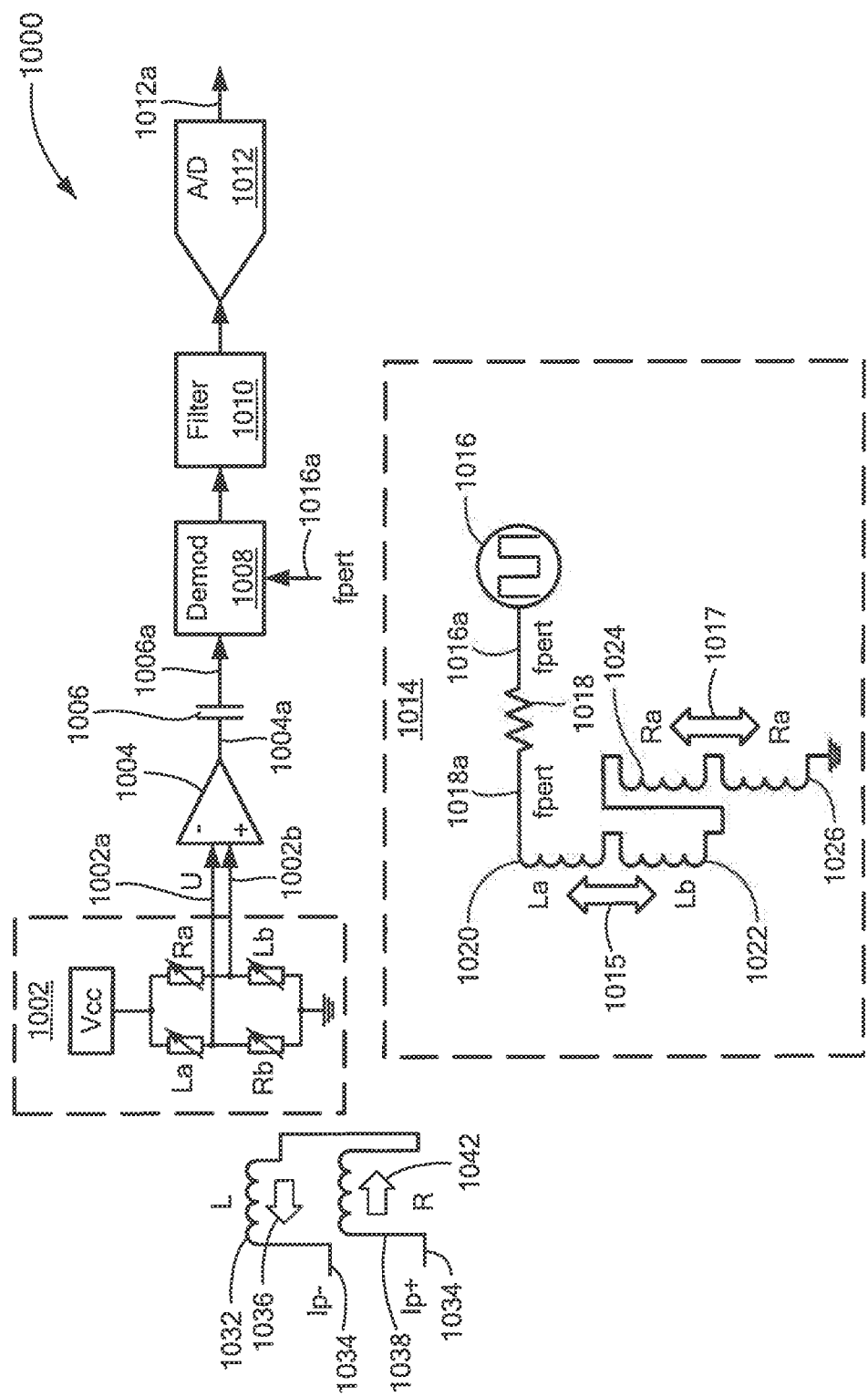
FIG. 10 is a schematic diagram of an illustrative current sensor having four TMR or GMR elements, arranged in one full bridge, including an amplitude detector circuit.

Referring now to FIG. 10, a magnetic field sensor 1000 can include four magnetoresistance elements coupled together in a full bridge arrangement 1002, which can be the same as or similar to the full bridge arrangement 700 of FIG. 7.

First and second magnetoresistance elements, La, Lb can both be disposed proximate to each other and on the left side, for example, on the left side of the current conductor 502 of FIG. 5. Third and fourth magnetoresistance elements Ra, Rb can both be disposed proximate to each other and on the right side, for example, on the right side of the current conductor 502 of FIG. 5. The full bridge arrangement 1002 can be coupled between a voltage source and a reference voltage, e.g., a ground voltage.

A first perturbing coil 1020 can be disposed proximate to the first magnetoresistance element, La, a second perturbing coil 1022 can be disposed proximate to the second magnetoresistance element, Lb, a third perturbing coil 1024 can be disposed proximate to the third magnetoresistance element, Ra, and a fourth perturbing coil 1026 can be disposed proximate to the fourth magnetoresistance element, Rb. A clock signal generator 1016 can generate a voltage signals 1016a coupled to a resistor 1018. A current signal 1018a can drive the first, second, third, and fourth perturbing coils 1022, 1022, 1024, 1026 in series.

Taken together the first, second, third, and fourth perturbing coils 1022, 1022, 1024, 1026 along with the clock signal generator 1016 and the resistor 1018 are referred to herein as a perturbing magnetic field signal generator 1014.

The difference signal 1004a, like the difference signal 712a of FIG. 7, is already a signal that represents a difference of signals generated by magnetoresistance elements on the left and right sides, for example left and right sides of the current conductor 502 of FIG. 5.

A differential signal 1002a, 1002b generate by the bridge circuit 1002 can be received by a differential amplifier 1004. The amplifier 1004 can generate a difference signal 1004a. The difference signal 1004a, like the difference signal 712a of FIG. 7, is a signal that represents a difference of signals generated by magnetoresistance elements on the left and right sides, for example left and right sides of the current conductor 502 of FIG. 5.

The difference signal 1004a can be received by a capacitor 1006, which can be coupled to a demodulator 1008, which can be coupled to a filter 1010, which can be coupled to an analog-to-digital converter 1012 to generate a digital signal 1012a. The demodulator 1008 and the filter 1010 form an amplitude detecting circuit. In some alternate embodiments, the demodulator 1008 can be replaced by a full wave rectifier circuit.

Values of the digital signal 1012a can be indicative of values of the sensed current signal 1009.

The first, second, third and fourth magnetoresistance elements La, Lb, Ra, Rb can have maximum response axes between top and bottom on the page.

The first, second, third and fourth perturbing coils can be operable to generate first, second, third, and fourth AC perturbing magnetic fields (e.g., 1415, 1417), respectively, between top and bottom on the page. Therefore, the first, second, third and fourth magnetoresistance elements La, Lb, Ra, Rb are directly responsive to the first, second, third, and fourth AC perturbing magnetic fields.

Coils 1032, 1038 are indicative of magnetic fields 1036, 1042 generated by a current 1034 passing through two portions of a current conductor proximate to the first, second, third and fourth magnetoresistance elements La, Lb, Ra, Rb, e.g., the current 501 of FIG. 5. The magnetic fields 1036, 1042 can be perpendicular to directions of maximum response axes of the first, second, third and fourth magnetoresistance elements La, Lb, Ra, Rb, i.e., between left and right on the page. This direction can be parallel to bias directions of the first, second, third and fourth magnetoresistance elements La, Lb, Ra, Rb. Thus, the magnetic fields 1036, 1042 can influence sensitivities of the of first, second, third and fourth magnetoresistance elements La, Lb, Ra, Rb.

Thus, the difference signal 1004a can be an AC voltage signal, with a frequency equal to a frequency of the clock signal 1022a and a magnitude influenced by the coils 1032, 1038.

As described herein, a sensed current 501 carried by the sensed current conductor 502 of FIG. 5, i.e., a sensed current 1034 (i.e., a local current 1034) carried by the first and second coils 1032, 1038, are described herein to be DC currents, merely for clarity. Thus, the first coil 1032 generates a magnetic field with a first direction indicated by arrow 1036, and the second coil 1038 generates a magnetic field with a second direction indicated by an arrow 1042. The first and second directions 1036, 1038 are in opposite directions from each other.

For reasons described above in conjunction with FIGS. 4 and 5, the magnetic fields with first and second directions 1036, 1038, respectively, result in opposite direction changes of sensitivity of the first and second magnetoresistance element La, Lb versus the third and fourth magnetoresistance element Ra, Rb. The changes of sensitivity are represented by the graphs 800 of FIG. 8.

The amplifier 1004 is coupled to receive the differential voltage signal 1002a, 1002b, which, as described above, can be an AC voltage signal like the signals 802a, 808a, 814a of FIG. 8, having an AC frequency equal to a frequency of the clock signal 1022a, and having an amplitude in accordance with an amplitude of the sensed (i.e., local) magnetic field having the directions 1036, 1038.

Referring briefly to FIGS. 8 and 9, it should be understood that the amplitude detecting circuit 1008, 1010 result in signals in a first two rows of graphs 800 turning into signals in a first two rows of graphs 900.

Values of the converted signal 1012a are directly related to values of the measured current 1034.

The magnetic field sensor 1000, which uses the perturbing magnetic fields with directions 1015, 1017 to indirectly measure the sensed current 1034 has advantages over a conventional magnetic field sensor that directly measures the sensed current 1034. For example, because the capacitor 1006 can block DC portions of signals to generate the AC coupled signal 1006a, any undesirable effects that may result from undesirable DC offset voltages generated by the first, second, third, and fourth magnetoresistance elements La, Lb, Ra, Rb can be reduced or eliminated. This is an advantage both for GMR and TMR elements.

In addition, though the magnetic field sensor 1000 can use either TMR elements or GMR elements as the first, second, third, and fourth magnetoresistance elements La, Lb, Ra, Rb, the magnetic field sensor 1000 is well suited for use of the TMR elements. It is known that TMR elements tend to have higher sensitivities than GMR elements. It is also known that TMR elements tend to have worse electrical noise and worse signal to noise ratios at low frequencies that GMR elements. Because the magnetic field sensor 1000 actually operates with relatively high frequencies generated by the clock signal generator 1016, the TMR elements, which have higher sensitivity that GMR elements, can avoid the higher noise at low frequencies The same advantages apply to all magnetic field sensors described herein.

It will be understood that the magnetic field sensor 1000 is an open loop magnetic field sensor having no feedback loop from the digital signal 1012a to an earlier point in the magnetic field sensor 1000. Feedback magnetic field sensors with closed loop feedback are also possible.

Figure 11:
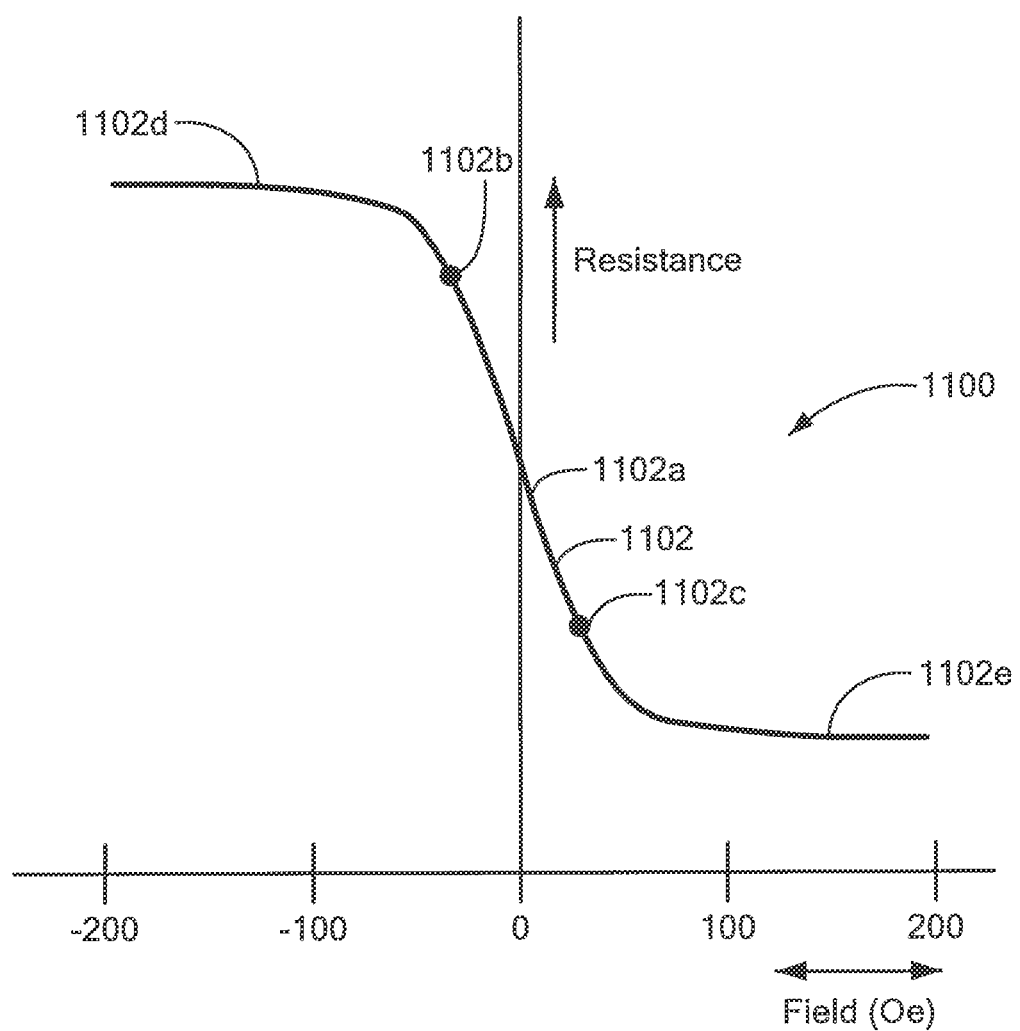
FIG. 11 is a graph showing a resistance transfer characteristic of a double pinned TMR or GMR element.

Referring now to FIG. 11, a graph 1100 has a horizontal axis with a scale in units of magnetic field in Oersteds (Oe) and a vertical axis with a scale in units of resistance in arbitrary units.

A curve 1102 is representative of a resistance transfer function of a double pinned magnetoresistance element, i.e., resistance versus magnetic field experienced by the double pinned magnetoresistance element. The resistance transfer function 1102 has a linear region 1102a between an upper saturation point 1102b and a lower saturation point 1102c. Regions 1102d, 1102e are in saturation. It should be understood that the linear region 1102a is not a perfectly straight line linear region.

The resistance transfer function 1102 is shown symmetrical about zero magnetic field. However, a double pinned magnetoresistance element tends to have a shape similar to the resistance transfer function 1102, but offset somewhat from zero magnetic field, particularly when reference and bias directions are not precisely orthogonal to each other.

It should be understood that a slope at a point on the resistance transfer function 1102 is equivalent to a sensitivity (e.g., ohms per oersted) of the illustrative double pinned magnetoresistance element at that point (i.e., at a particular external magnetic field).

It should be apparent that a double pinned GMR or TMR element has a linear region that is not a perfectly straight line.

FIGS. 12-15 show current sensors similar to the current sensor of FIGS. 5 and 10, but include not only a plurality of magnetoresistance elements arranged in a bridge operable to sense a current, but also a single magnetoresistance element operable to sense a stray magnetic field. Circuits described in conjunction with FIGS. 16, 17, 24, and 25 can use the sensed stray field to correct for errors in the sensed current. The circuits described in conjunction with FIGS. 18 and 26 can be disposed upon common substrates, respectively.

While FIGS. 12-15 show the signal magnetoresistance element, it should be understood that, in other embodiments, the single magnetoresistance element can be replaced by a plurality of magnetoresistance elements coupled in series or in parallel or any combination of series and parallel, with respective reference layer magnetic directions parallel to each other. Maximum response axes can be parallel to the magnetic directions of the reference layers. However, in other embodiments, the maximum response axes are not parallel to the reference directions.

Though a particular current sensor is used in examples herein (e.g., the current sensor of FIG. 10), as described above, the stray field sensor can be used to sense a stray (external) magnetic field associated with any magnetic field sensor.

Referring now to FIG. 12, a current sensor 1200 can include aspects of the current sensor of FIG. 5. Current conductor 1202 with current conductor portions 1202a, 1202b can be the same as or similar to the current conductor 502 with current conductor portion 502a, 502b. Magnetoresistance elements A, B, D, E can be the same as or similar to the magnetoresistance elements La, Lb, Ra, Rb, respectively, of FIGS. 5 and 7. Current 1204 can be the same as or similar to the current 501 of FIG. 5. Magnetic field directions 1206a, 1206b can be the same as or similar to the magnetic field directions 503a, 503b of FIG. 5. Circuit 1212 can include circuit portions of the circuit 512 of FIG. 5 such as the circuit 1000 of FIG. 10 but can include additional circuit portions described below in conjunction with FIG. 18 or 25.

Associated with magnetoresistance elements A, B, D, E, dashed arrows are representative of reference directions (which can be maximum response directions) of the magnetoresistance elements A, B, D, E, which are parallel to each other. This is also the reference direction of the reference layer structures of FIGS. 3 and 3A. Orthogonal coordinates x and y are used to describe and x-y plane in figures herein.

Unlike the current sensor 500 of FIG. 5, the current sensor 1200 can include a single (or magnetoresistance element C (or, as described above, a plurality of magnetoresistance elements with parallel reference layer magnetic directions) disposed at a position so that the magnetoresistance element C is generally responsive to external magnetic fields parallel to the y axis and not responsive to magnetic fields in directions parallel to the x axis, e.g., magnetic fields indicated by arrows 1206a, 1206b that the current sensor and magnetoresistance elements A, B, D, E attempt to measure. To this end, the single magnetoresistance element C has a reference direction indicated by a dashed arrow, which can also be the direction of maximum response of the magnetoresistance element C.

The single magnetoresistance element C can be disposed at a position at which the single magnetoresistance element C is substantially not responsive to magnetic fields generated by the current 1204. In essence, at the position of the single magnetoresistance element C, magnetic fields generated by the current 1204 tend to be in a z direction, to which the single magnetoresistance element C is substantially not responsive.

It should be apparent that all of the magnetoresistance elements A, B, C, D, E can have the same structure and the same internal magnetic directions.

A coil 1208 or other magnetic field generating structure (e.g., straight conductor) can be disposed proximate to the single magnetoresistance element C. The coil 1208 can be operable to generate an AC magnetic field in a direction of an arrow 1210 parallel to they axis.

Operation of the current sensor 1200 and single magnetoresistance element C is described more fully in conjunction with figures below.

Referring now to FIG. 12A, in which like elements of FIG. 12 are shown having like reference designations, the four magnetoresistance elements A, B, D, E can be arranged in a full bridge coupled between a power supply voltage and a reference voltage, for example, ground. A differential voltage V can be generated by the full bridge arrangement. The full bridge arrangement can be the same as or similar to the full bridge arrangement 700 of FIG. 7.

Referring now to FIG. 12B, which includes the single magnetoresistance element C of FIG. 12, can be driven with a current generator to achieve a voltage signal. However, FIGS. 17, 18, 25, and 26 described below describe driving the single magnetoresistance element C with a voltage source to achieve a current signal followed by a current mirror circuit and a resistor to achieve a voltage signal. The two ways of driving the magnetoresistance element C result in similar voltage signals. However, graphs shown below describe resistances, which are directly related to the above-described current signals.

Referring now to FIG. 13, in which like elements of FIG. 12 are shown having like reference designations, a current sensor 1300 can include not only a coil 1308 or other magnetic field generating structure like the coil 1208 of FIG. 1, but also another coil 1312 or other magnetic field generating structure disposed proximate to the single magnetoresistance element C. The coil 1308 can generate an AC magnetic field in a direction of an arrow 1310 and the coil 1312 can generate an AC magnetic field in a direction of an arrow 1314.

Current 1304 can be the same as or similar to the current 501 of FIG. 5. Magnetic field directions 1306a, 1306b can be the same as or similar to the magnetic field directions 503a, 503b of FIG. 5.

Operation of the current sensor 1300 and single magnetoresistance element C is described more fully in conjunction with figures below.

FIGS. 13A and 13B will be understood from the discussion above about FIGS. 12A and 12B.

Referring now to FIG. 14, a current sensor 1400 can include aspects of the current sensor of FIG. 5. Current conductor 1402 with current conductor portions 1402a, 1402b can be the same as or similar to the current conductor 502 with current conductor portion 502a, 502b. Magnetoresistance elements A, B, D, E can be the same as or similar to the magnetoresistance elements La, Lb, Ra, Rb, respectively, of FIGS. 5 and 7. Current 1404 can be the same as or similar to the current 501 of FIG. 5. Magnetic field directions 1406a, 1406b can be the same as or similar to the magnetic field directions 503a, 503b of FIG. 5. Unlike the magnetoresistance elements A, B, D, E of FIG. 12, which are shown to be GMR elements, the magnetoresistance element A, B, D, E of FIG. 15 are shown to be TMR elements, each TMR element having a plurality of TMR pillars coupled in series.

Circuit 1412 can include circuit portions of the circuit 514 of FIG. 5 such as the circuit 1000 of FIG. 10 but can include additional circuit portions described below in conjunction with FIG. 18 or 26.

Associated with magnetoresistance elements A, B, D, E, dashed arrows are representative of parallel reference directions (which can be parallel to maximum response directions of the magnetoresistance elements A, B, D, E). This is also the reference direction of the reference layer structures of FIGS. 3 and 3A.

Unlike the current sensor 500 of FIG. 5, the current sensor 1400 can include a single magnetoresistance element C having a plurality of TMR pillars (or, as described above, a plurality of magnetoresistance elements, each having a plurality of TMR pillars and each with reference magnetic directions parallel to each other) disposed at a position so that the magnetoresistance element C is generally not responsive to magnetic fields in directions indicated by arrows 1406a, 1406b that the current sensor and magnetoresistance elements A, B, D, E attempt to measure. To this end, the magnetoresistance element C has a reference direction indicated by a dashed arrow parallel to the other reference directions, which can also be the direction of maximum response of the magnetoresistance element C. Unlike the single magnetoresistance element C of FIG. 12, the magnetoresistance element C in FIG. 14 is shown to be a TMR element having a plurality of pillars.

The single magnetoresistance element C can be disposed at a position at which the single magnetoresistance element C is substantially not responsive to magnetic fields generated by a current 1404. In essence, at the position of the single magnetoresistance element C, magnetic fields generated by the current 1404 tend to be in a z direction, to which the single magnetoresistance element C is substantially not responsive.

It should be apparent that all of the magnetoresistance elements A, B, C, D, E can have the same structure and the same internal magnetic directions.

A plurality of coils 1408 or other magnetic field generating structures can be disposed proximate to the single magnetoresistance element C. The coils 1408 can be operable to generate a plurality of AC magnetic fields in a direction of an arrow 1410.

Operation of the current sensor 1400 and single magnetoresistance element C is described more fully in conjunction with figures below.

FIGS. 14A and 14B will be understood from the discussion above about FIGS. 12A and 12B.

Referring now to FIG. 15, in which like elements of FIG. 14 are shown having like reference designations, a current sensor 1500 can include not only coils 1508 or other magnetic field generating structure like the coil 1408 of FIG. 14, but also another coil 1512 or other magnetic field generating structure disposed proximate to the single magnetoresistance element C. The 1508 can generate an AC magnetic field in a direction of an arrow 1510 and, the coil 1512 can generate an AC magnetic field in a direction of an arrow 1514.

Current 1504 can be the same as or similar to the current 501 of FIG. 5. Magnetic field directions 1506a, 1506b can be the same as or similar to the magnetic field directions 503a, 503b of FIG. 5.

Operation of the current sensor 1500 and single magnetoresistance element C is described more fully in conjunction with figures below.

FIGS. 15A and 15B will be understood from the discussion above about FIGS. 12A and 12B.

Figures below use TMR elements rather than the GMR elements of FIGS. 12 and 13. However, the same concepts apply to GMR elements.

Figure 16:
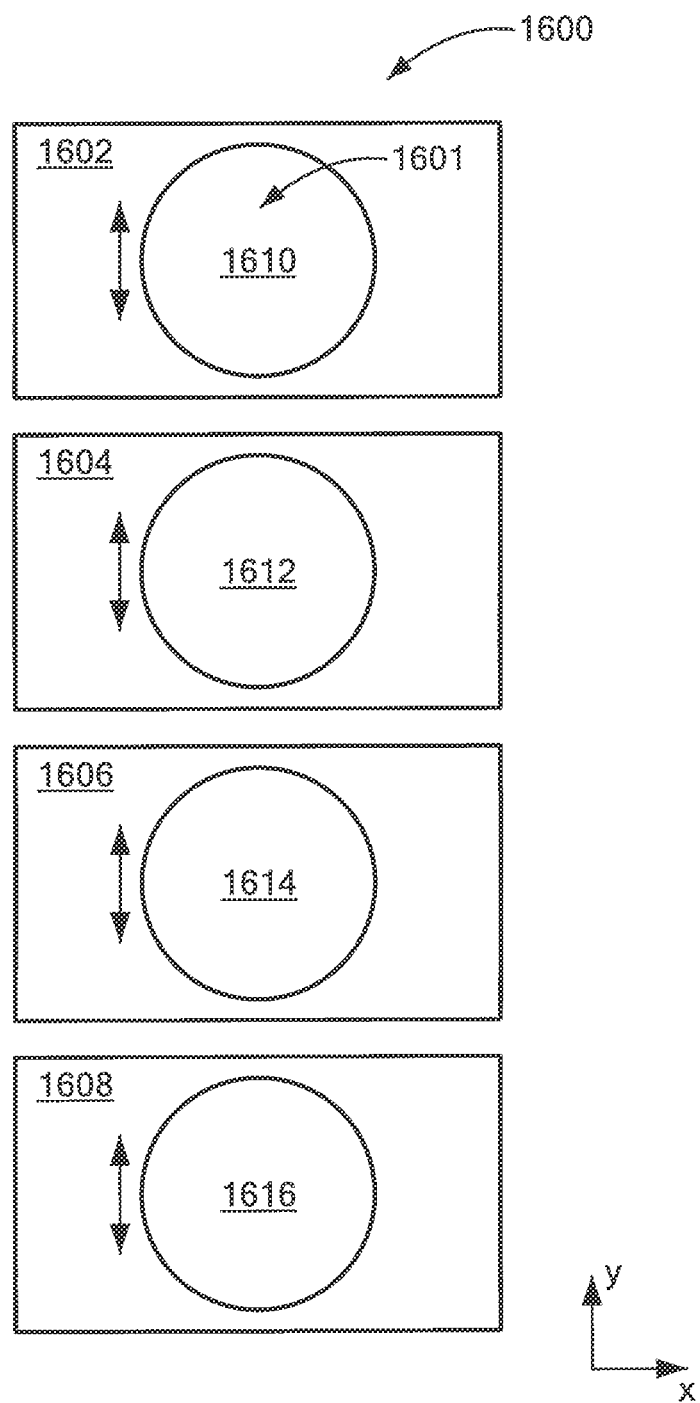
FIG. 16 is a block diagram showing the single TMR element of FIG. 14 having the plurality of TMR pillars and showing four current conductors that can be used to generate the four AC magnetic fields of FIG. 14.

Referring now to FIG. 16, a TMR element 1601 can have a plurality of TMR pillars, e.g., four TMR pillars 1610, 1612, 1614, 1616, and can be the same as or similar to the single TMR element C of FIG. 14. A plurality of coils, e.g., four coils 1602, 1604, 1606, 1608, or other magnetic field generating structures such as a current conductor can be the same as or similar to the plurality of coils 1408 of FIG. 14.

The plurality of coils 1602, 1604, 1606, 1608 can be operable to generate a plurality of magnetic fields, e.g., four magnetic fields, parallel to a y direction and indicated by arrows, passing through the plurality of TMR pillars. The four TMR pillars can have respective maximum response axes parallel to a y direction.

Figure 17:
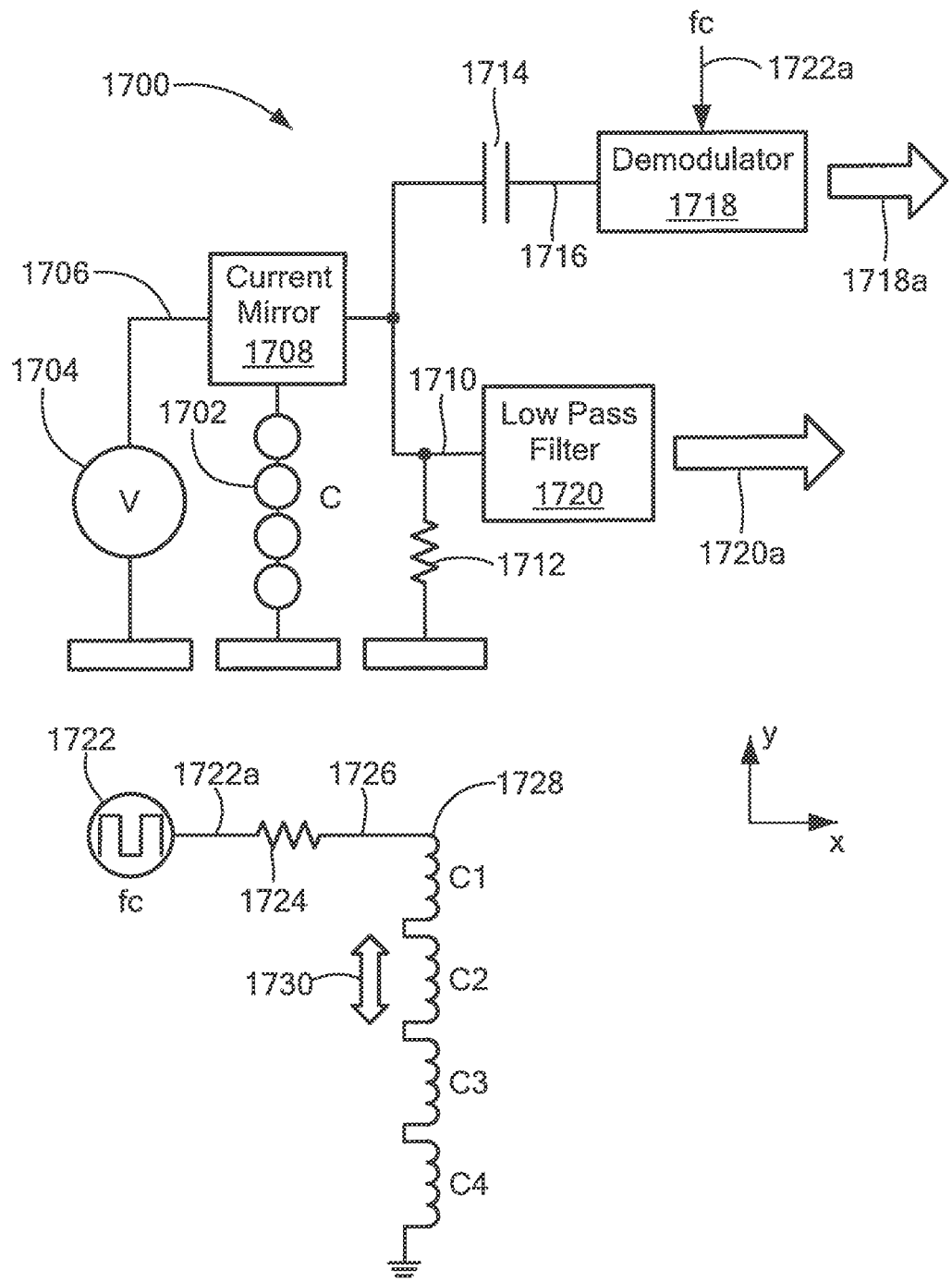
FIG. 17 is a block diagram showing a portion of a magnetic field sensor and having the single TMR element of FIGS. 14 and 14B, but here driven by a voltage source, coupled to a demodulator and coupled to a low pass filter.

Referring now to FIG. 17, a circuit portion 1700 can include a one or more TMR elements, here a single TMR element 1702 having a plurality of TMR pillars, e.g., 1610, 1612, 1614, 1616 of FIG. 16. The single TMR element can be driven by a voltage source 1704 to generate a current signal 1706 that changes in response to a magnetic field. A current mirror circuit 1708 can receive the current signal 1706 and can generate a voltage signal 1710 by a mirrored current passing through a resistor 1712.

A plurality of coils 1728, C1, C2, C3, C4 can be the same as or similar to the plurality of coils 1602, 1604, 1606, 1608 of FIG. 16 and can be operable to generate one or more magnetic fields, e.g., four magnetic fields, indicated by an arrow 1730, all in the same direction, and all parallel to the y axis. In some embodiments, only one, or one or more, coils are used to generate magnetic fields parallel to the y axis.

A clock generator 1722 can generate a clock signal 1722a at a frequency fc. The clock signal 1722a can be received by at one end of a resistor 1724. A current signal 1726 can result at the other end of the resistor 1724. The current signal 1726 can drive the plurality of coils C1, C2, C3, C4 to generate the AC magnetic fields 1730 with the frequency of fc proximate to the plurality of pillars of the TMR element 1702.

Directions of the AC magnetic fields 1730 are parallel to the maximum response axis of the TMR element 1702.

Current signal 1706 (and voltage signal 1710) can be comprised of a frequency component at the frequency fc that is generated by the coils C1, C2, C3, C4. The current signal 1706 can also be comprised of a lower frequency band of frequencies resulting from a stray (external) magnetic field sensed by the single magnetoresistance element 1702, in particular, resulting from a y component of the stray magnetic field when projected onto the x-y plane.

The voltage signal 1710 can be AC filtered by a capacitor 1714 to generate an AC coupled signal 1716.

A demodulator 1718 can receive the AC coupled signal 1716 and can receive the clock signal 1722a. In operation, the demodulator 1718 can multiply the AC coupled signal 1716 with the clock signal 1722a and low pass filter the result to generate a demodulated signal 1718a. The demodulator 1718 can include a square wave demodulator comprised of a switching circuit. It is desirable that the frequency fc be substantially above a frequency of a stray (external) magnetic field that the single TMR element senses. The demodulator 1718 can also include a low pass filter.

The demodulator 1718 can essentially operate as an amplitude detecting circuit, and the demodulated signal 1718a is representative of an amplitude of the AC coupled signal 1716. Thus, it will be appreciated that the demodulator 1718 can be replaced with other forms of amplitude detecting circuits, for example, a rectifier and filter.

A low pass filter 1720 can receive the AC voltage signal 1710 and can generate a filtered signal 1720a.

In operation, a stray magnetic field with a component in a y direction when projected onto the x-y plane can result in a low frequency part of the voltage signal 1710. In contrast, a stray magnetic field with a component parallel to the x axis when projected onto the x-y plane (parallel to the arrows 1506a, 1506b of FIG. 15) can amplitude modulate the signal component at the frequency fc, i.e., can generate AM sidebands around the signal component at the frequency fc of the AC coupled signal 1716. The amplitude modulation is the result of the x component of the stray magnetic field being parallel to the bias direction of the TMR element 1702, which can add to or subtract from the bias field experienced by free layer(s) of the TMR element 1702, essentially resulting in AC changes of the sensitivity of the TMR element 1702.

Thus, in operation, the filtered signal 1720a is indicative of the low frequency part of the voltage signal 1710 and is primarily responsive to the y component of the stray magnetic field. A simulation of this relationship is described below in conjunction with FIG. 19. In contrast, the demodulated signal 1718a is indicative of the amplitude of the AC coupled signal 1716 and is primarily responsive to the x component of the stray magnetic field. A simulation of this relationship is described below in conjunction with FIG. 20. However, the demodulated signal 1718a and the filtered signal 1720a can each be responsive to both the x component and the y component.

Figure 19:
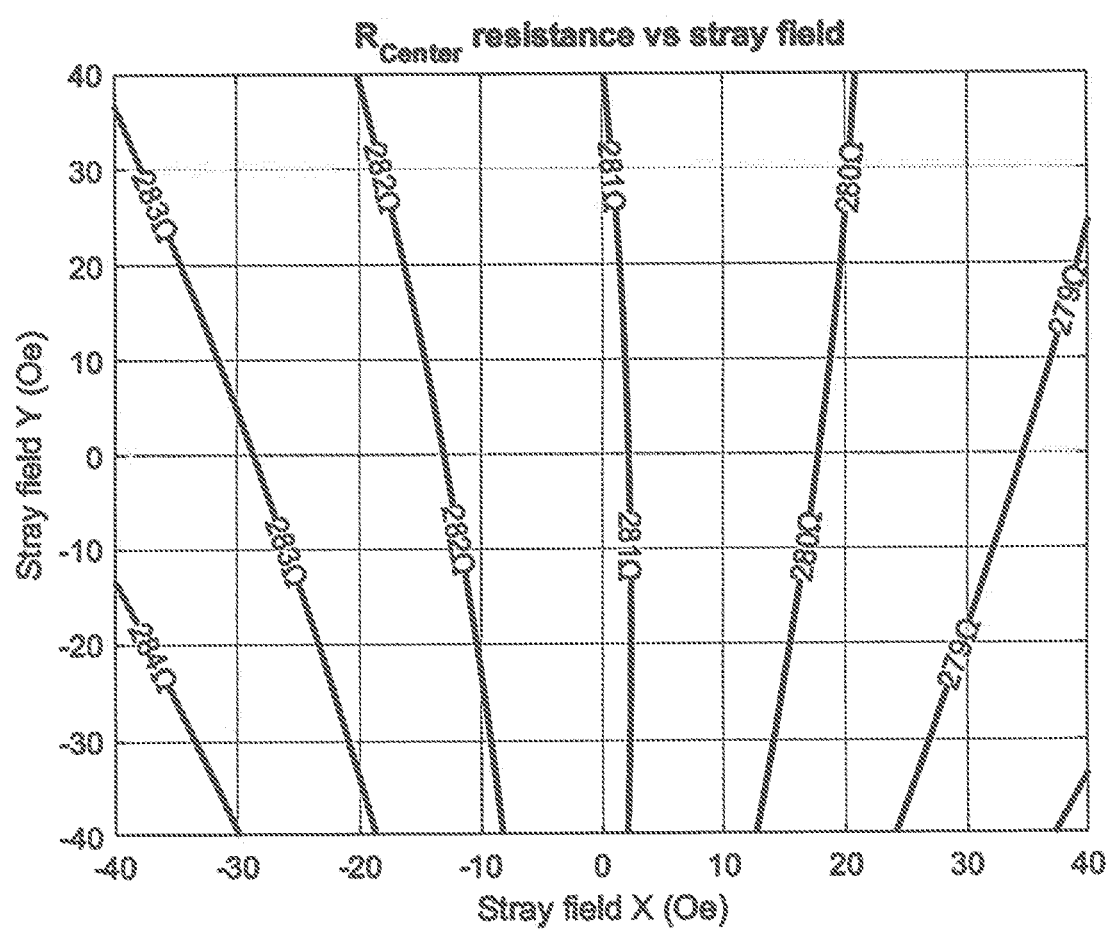
FIG. 19 is a graph showing a relationship of measured x-direction values of a signal generated by the low pass filter of FIGS. 17 and 18 when in the presence of various stray magnetic fields.
Figure 20:
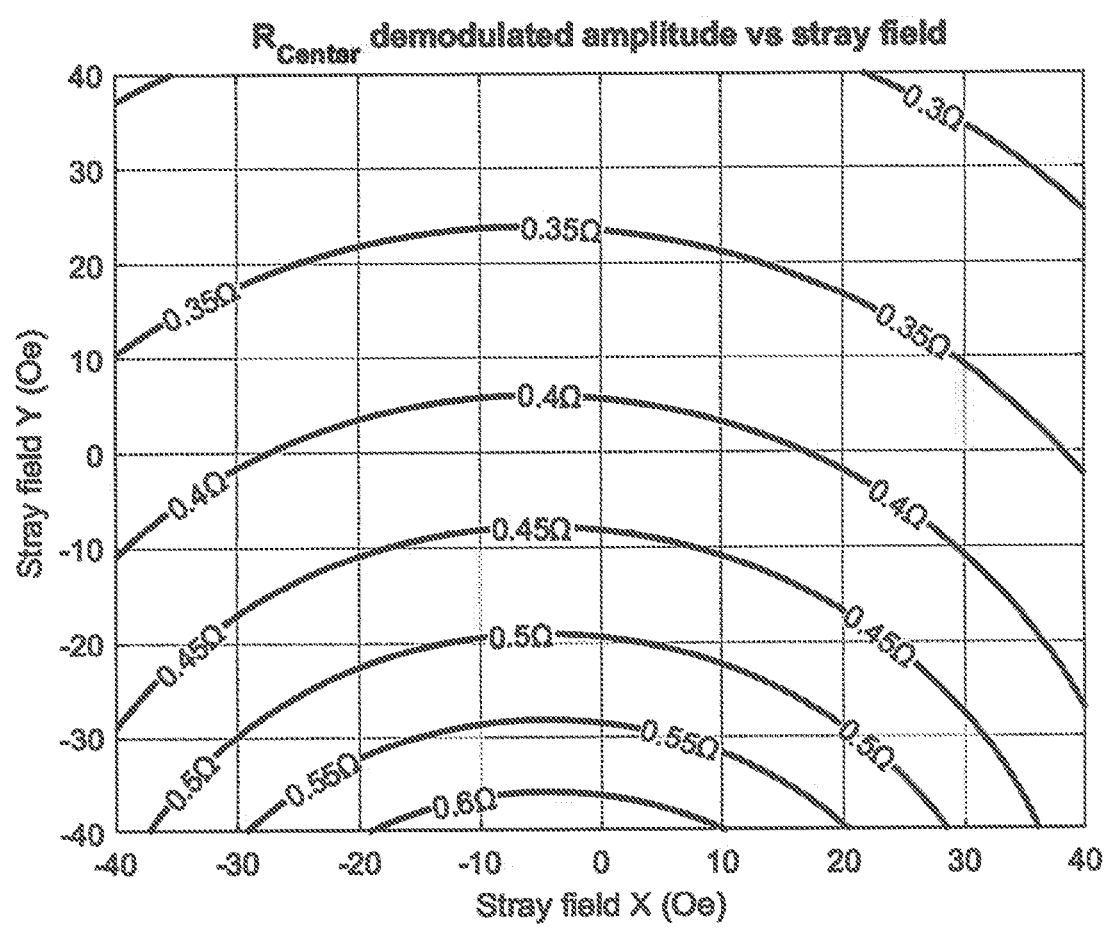
FIG. 20 is a graph showing a relationship of measured y-direction values of a signal generated by demodulator of FIGS. 17 and 18 when in the presence of various stray magnetic fields.

However, it will become apparent from simulations in conjunction with FIGS. 19 and 20 that the signals 1718a, 1720a are also partly responsive to magnetic field components in the x-y plane orthogonal to those described above. Thus, values of the signals 1718a, 1720a are referred to herein as "measured-x-dominant values" and "measured-y-dominant values," respectively.

Figure 18:
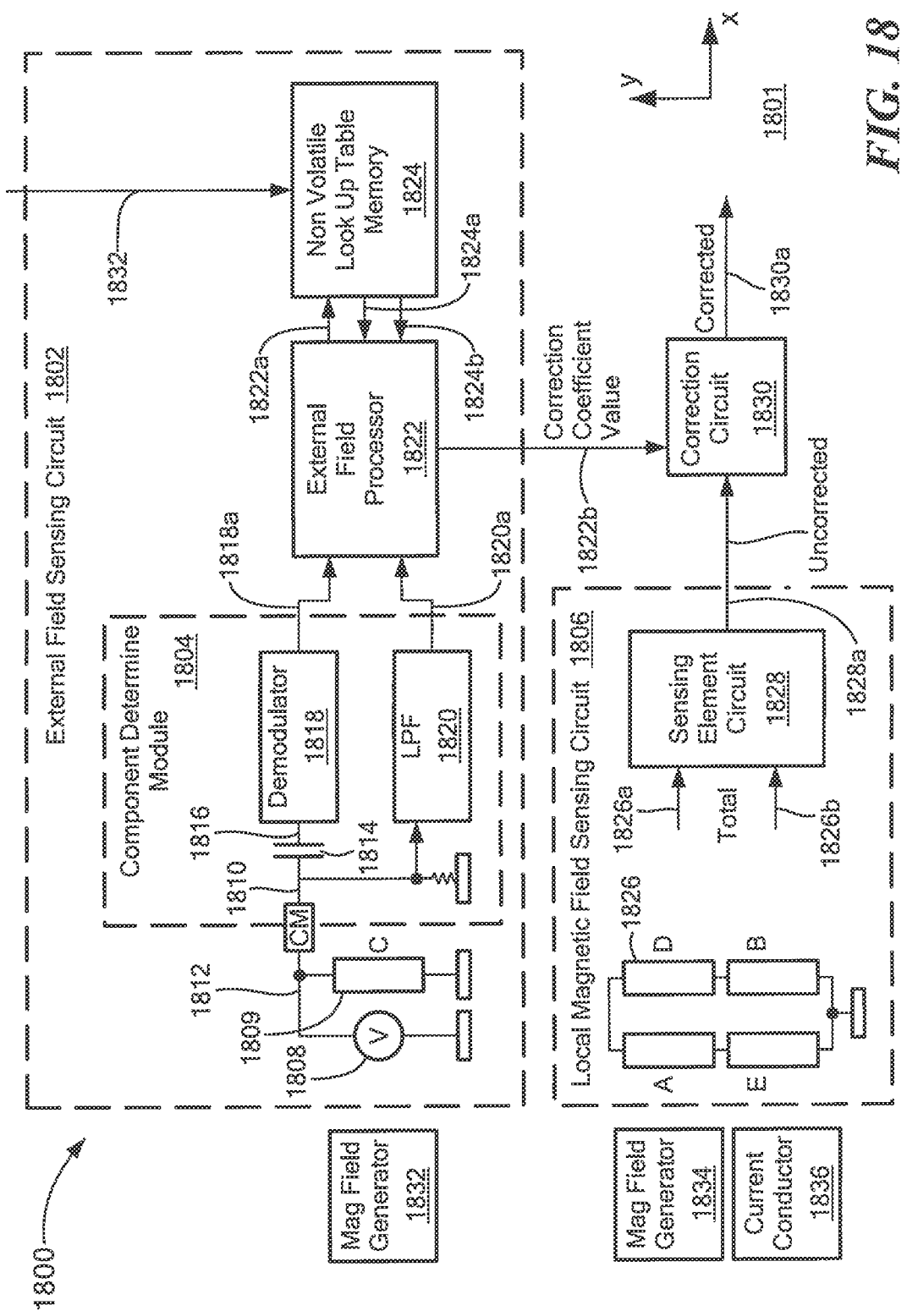
FIG. 18 is a block diagram of an illustrative magnetic field sensor having the plurality of magnetoresistance element and the single magnetoresistance element of FIGS. 14 14A, and 14B, but here driven by a voltage source, and also including the demodulator and low pass filter of FIG. 17, an external field processor, a non-volatile look up table memory, a sensing element circuit, and a correction circuit.

Referring now to FIG. 18, a magnetic field sensor 1800 can be disposed upon a surface of a substrate 1801, e.g., a semiconductor substrate. An x-y plane can be upon the surface 1801. The magnetic field sensor 1800 can include an external field sensing circuit 1802 operable to sense an external (e.g., stray) magnetic field generated outside of the magnetic field sensor 1800.

The external field sensing circuit 1802 can include a single magnetoresistance (TMR or GMR) element 1809 (or more than one with the parallel maximum response axes) driven by a voltage generator 1808 to result in a current signal 1812 and a voltage signal 1810. The external field sensing circuit 1802 can also include a component determination module 1804 having a capacitor 1814, a demodulator 1818, and a low pass filter 1820 the same as or similar to elements of FIG. 17.

As described above in conjunction with FIG. 17, the external field sensing circuit 1802 is operable to generate a demodulated signal 1818a primarily responsive to a component of stray magnetic field in the x direction, and a filtered signal 1820a primarily responsive to a component of the stray magnetic field in the y direction. However, it will become apparent from simulations in conjunction with FIGS. 19 and 20 that the signals 1818a, 1820a are only primarily responsive to the stated components and each is responsive to both the x component and the y component. Thus, values of the signals 1818a, 1820a can be referred to as measured x-dominant values 1818a and measured-y-dominant values 1820a, respectively. The measured-x-dominant values 1818a are more indicative of x components and less indicative of y components of the external magnetic field projected onto the x-y plane, but are responsive to both the x component and the y component. The measured-y-dominant values 1820a are more indicative of the y components and less indicative of the x components of the external magnetic field projected onto the x-y plane, but are responsive to both the x component and the y component.

The measured-x-dominant values 1818a and the measured-y-dominant values 1820a can be received by an external field processor 1822.

A non-volatile look up table memory 1824, for example, and EEPROM, can also be coupled to the external field processor 1822. The non-volatile look up table memory 1824 can store a matrix of predetermined correction coefficients received as a signal 1832 from outside of the magnetic field sensor 1800 prior to operation of the magnetic field sensor 1800.

Because a combination of the measured-x-dominant values 1818a and the measured-y-dominant values 1820a are deterministically indicative of actual x and y components, respectively, of the external magnetic field projected upon the x-y plane, values of the measured-x-dominant values 1818a and the values of the measured-y-dominant values 1820a can be used in combination to acquire a correction coefficient from the non-volatile look up table memory 1824, using the non-volatile look up table memory 1824 as a look up table. To this end, the external field processor can send a control signal 1822a to the non-volatile look up table memory 1824 in accordance with the combination of the measured-x-dominant values 1818a and the measured-y-dominant values 1818b.

In operation, the external field processor 1822 can identify a selected one of the correction factors to generate a selected correction coefficient 1822b in accordance with the measured x-dominant values 1818a and the measured y-dominant values 1822a.

In some embodiments, the magnetic field sensor 1800 can also include a local magnetic field sensing circuit 1806, which, for example, can be like the magnetic field sensor 1000 of FIG. 10, but which is here shown in more generic blocks. The local magnetic field sensing circuit 1806 can include a bridge circuit 1826 to generate a differential magnetic field signal 1826a, 1826b. The differential magnetic field signal 1826a, 1826b can be responsive to both a local magnetic field (that is desirable to sense, e.g., in the x-direction of FIG. 14) and also the external (stray) magnetic field having projected x and y directions sensed by the external field sensing circuit 1802. The differential magnetic field signal 1826a, 1826b is also referred to as a total magnetic field signal 1826a, 1826b.

The sensing element circuit can be the same as or similar to some elements of the magnetic field sensor 1000 of FIG. 10.

A magnetic field generator 1832 having one or more coils can be the same as or similar to the coils magnetic field generator having the coils 1728 of FIG. 17 and can be disposed proximate to the single magnetoresistance element 1809 upon the substrate 1801.

The sensing element circuit 1828 can be operable to generate an uncorrected signal 1828a. The uncorrected signal 1828a can be responsive to both the local field that is desirable to measure, and also the external (e.g., stray) magnetic field that is undesirable. In the case of the magnetic field sensor 1000 of FIG. 10, it is the local magnetic fields 1036, 1042 that are desirable to measure, which are generated by current flowing in the current conductor 502 of FIG. 5.

The local magnetic fields 1036, 1042 of FIG. 10 can be circular around the portions of the current conductor represented by the coils 1032, 1036. Thus, the local magnetic fields 1036, 1042 tend to intersect the single magnetoresistance element 1810 in a z direction perpendicular to the x-y plane of the substrate, a direction to which the single magnetoresistance element 1810 is not responsive.

The magnetic field sensor 1800 can include a correction circuit 1830 to receive the uncorrected signal 1828a and to receive the selected correction coefficient value 1822b (responsive to the external (e.g., stray) magnetic field and substantially not responsive to the local magnetic field). The correction circuit 1830 can be operable to generate a corrected signal 1830 responsive to the local magnetic field and substantially not responsive to the external (e.g., stray) magnetic field. In some embodiments, the correction circuit performs a multiplication of the uncorrected signal 1828a by the selected correction coefficient value 1822b. Thus, a more accurate measurement of the local magnetic field alone is obtained.

A magnetic field generator 1834 can be the same as or similar to the magnetic field generator 1014 of FIG. 10. A current conductor 1836 can be the same as or similar to the current conductor 1402, 1502 of FIG. 14 or 15.

Referring now to FIG. 19, a graph has a horizontal axis with a scale in units of an x component of a stray magnetic field projected onto the x-y plane of the substrate of FIG. 18 in Oersteds. The graph also has a vertical axis with a scale in units of a y component of a stray magnetic field projected onto the x-y plane of the substrate of FIG. 18 in Oersteds.

Curves are so-called "isolines" indicative of different measured-x-dominant values of the filtered signal 1820a generated by the low pass filter 1820. Vertical isolines would indicate that the filtered signal 1820a is indicative of only x components of the external (e.g., stray) magnetic field. However, the isolines are not vertical, and thus, the filtered signal has values that are indicative of both x and y components of the external magnetic field. The isolines are somewhat vertical. Thus, the values of the signal 1820a are referred to above as the measured-x-dominant values.

Referring now to FIG. 20, a graph has a horizontal axis with a scale in units of an x component of a stray magnetic field projected onto the x-y plane of the substrate of FIG. 18 in Oersteds. The graph also has a vertical axis with a scale in units of a y component of a stray magnetic field projected onto the x-y plane of the substrate of FIG. 18 in Oersteds.

Curves are isolines indicative of different measured-y-dominant values of the demodulated signal 1818a generated by the demodulator 1818. Horizontal isolines would indicate that the demodulated signal 1818a is indicative of only y components of the external (e.g., stray) magnetic field. However, the isolines are not horizontal, and thus, the filtered signal has values that are indicative of both x and y components of the external magnetic field. The isolines are somewhat horizontal. Thus, the values of the signal 1820a are referred to above as the measured-y-dominant values.

Figure 21:
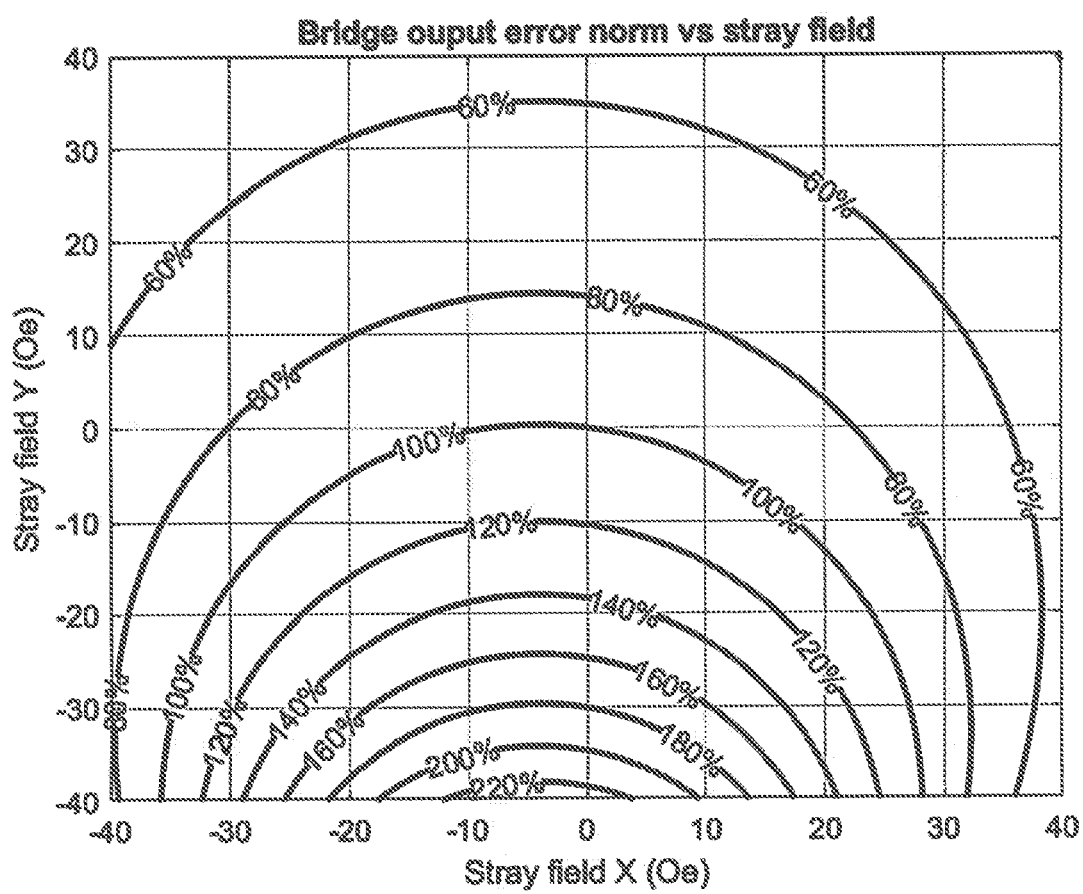
FIG. 21 is a graph showing errors of a measured current signal measured by a magnetic field sensor, e.g., the plurality of magnetic field sensing elements of FIG. 18, versus true stray field x-direction values and true stray field y-direction values when in the presence of various stray magnetic fields for the signals generated by the low pass filter and demodulator of FIG. 18.

Referring now to FIG. 21, a graph has a horizontal axis with a scale in units of an x component of a stray magnetic field projected onto the x-y plane of the substrate of FIG. 18 in Oersteds. The graph also has a vertical axis with a scale in units of a y component of a stray magnetic field projected onto the x-y plane of the substrate of FIG. 18 in Oersteds.

Curves are isolines, each indicative of a different error of the uncorrected signal 1828a of FIG. 18. An error of 100% is indicative of a no error. Errors range from about 40% to about 220%. These errors are errors prior to operation of the correction circuit 1830 of FIG. 18.

Figure 22:
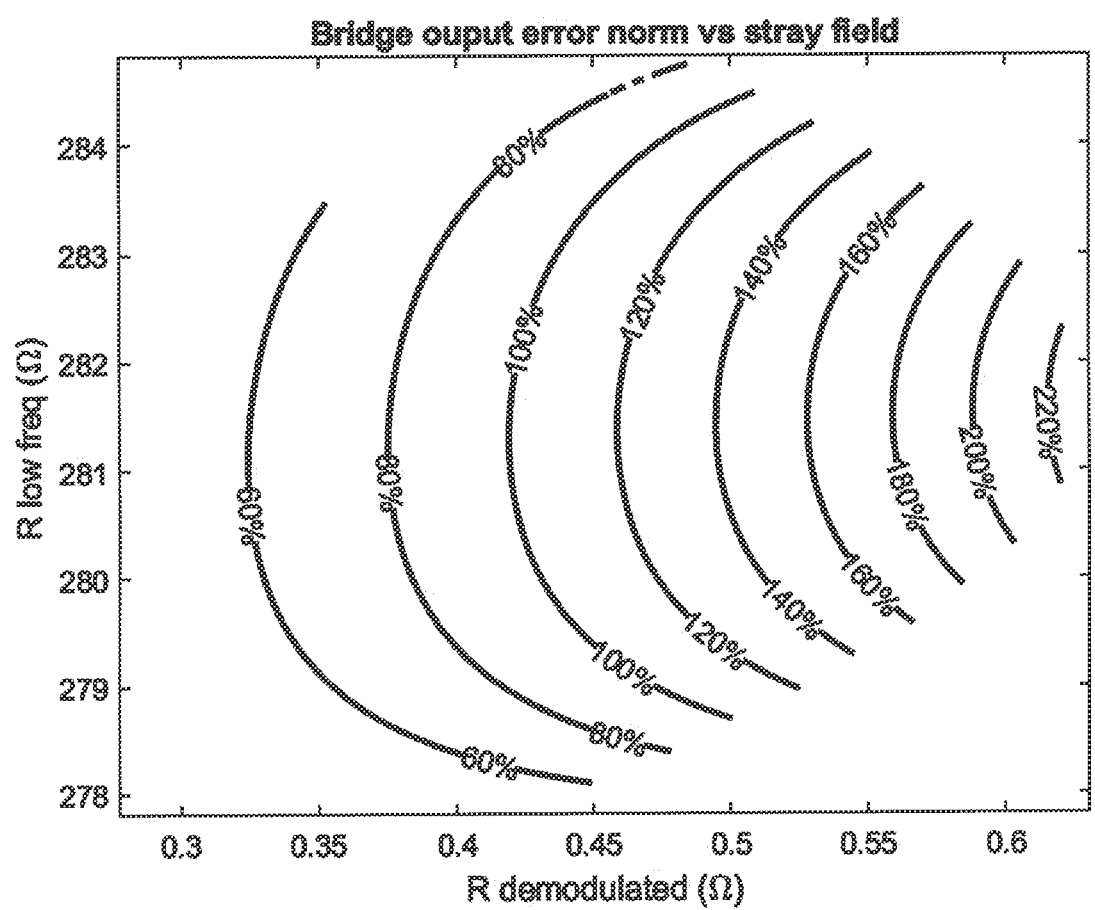
FIG. 22 is a graph showing normalized errors (100% best) from the plurality of magnetoresistance element of FIG. 18 when arranged in a bridge as shown in FIG. 18, for different amplitudes of signal generated by the low pass filter and the demodulator of FIG. 18 when in the presence of various stray magnetic fields, normalized by a configuration without stray fields.

Referring now to FIG. 22, a graph has a horizontal axis with a scale in units of ohms for the measured-x-dominated values of the demodulated signal 1818a of FIG. 18. The graph also has a vertical axis with a scale in units of ohms for the measured-y-dominated values of the filtered signal 1820a of FIG. 18.

Curves are isolines, each indicative of a different error generated by the bridge 1826 when in the presence of the external (e.g., stray) magnetic field. An error of 100% is indicative of a no error. Errors range from about 50% to about 240%. These errors are errors prior to operation of the correction circuit 1830 of FIG. 18.

Figure 23:
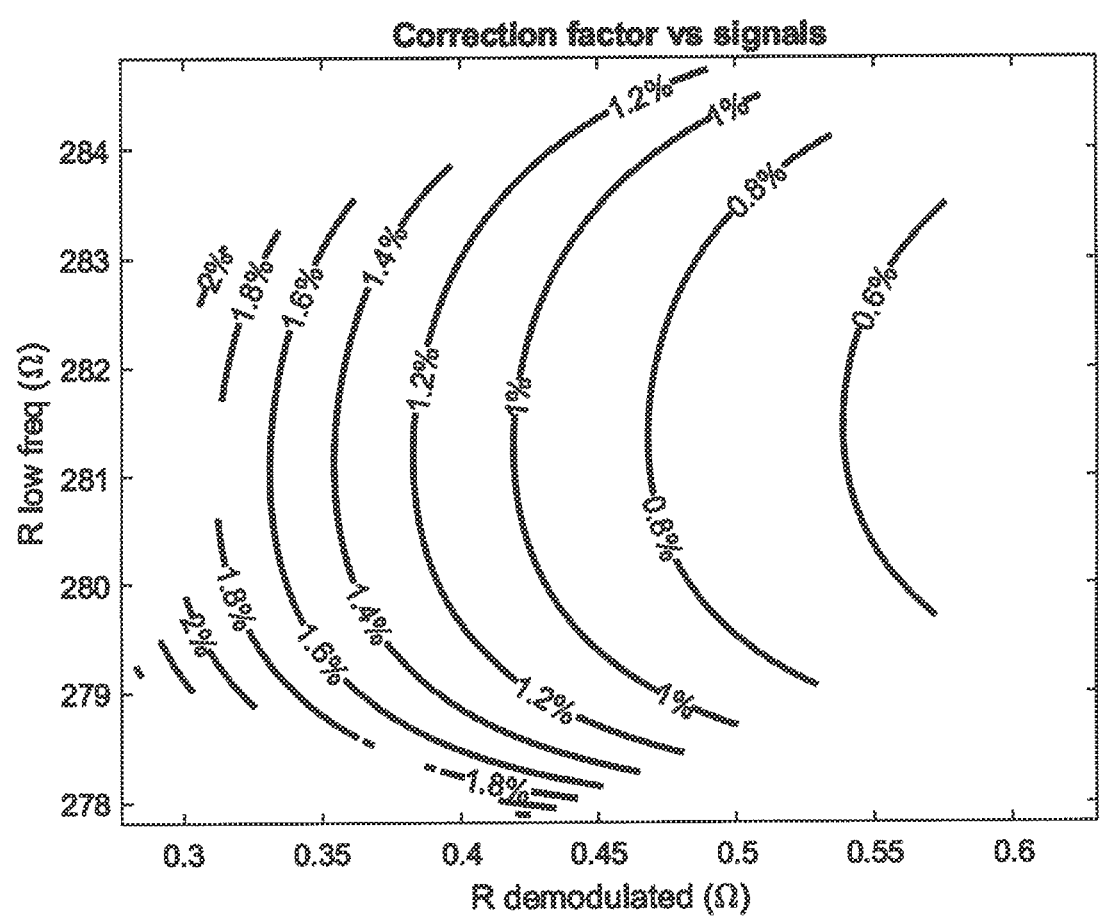
FIG. 23 is a graph showing correction factors that can be applied to a signal generated by the plurality of magnetoresistance elements arranged in the bridge of FIGS. 18 and 7 for different signal values generated by the low pass filter and by the demodulator of FIG. 18.

Referring now to FIG. 23, a graph has a horizontal axis with a scale in units of ohms for the measured-x-dominated values of the demodulated signal 1818a of FIG. 18. The graph also has a vertical axis with a scale in units of ohms for the measured-y-dominated values of the filtered signal 1820a of FIG. 18.

Curves are isolines, each indicative of a different correction factor, i.e., a value of the selected correction coefficient 1822b, when in the presence of the external (e.g., stray) magnetic field. Correction values range from about 0.5 to about 2.4, which is in concert with the curves of FIG. 22.

Figure 24:
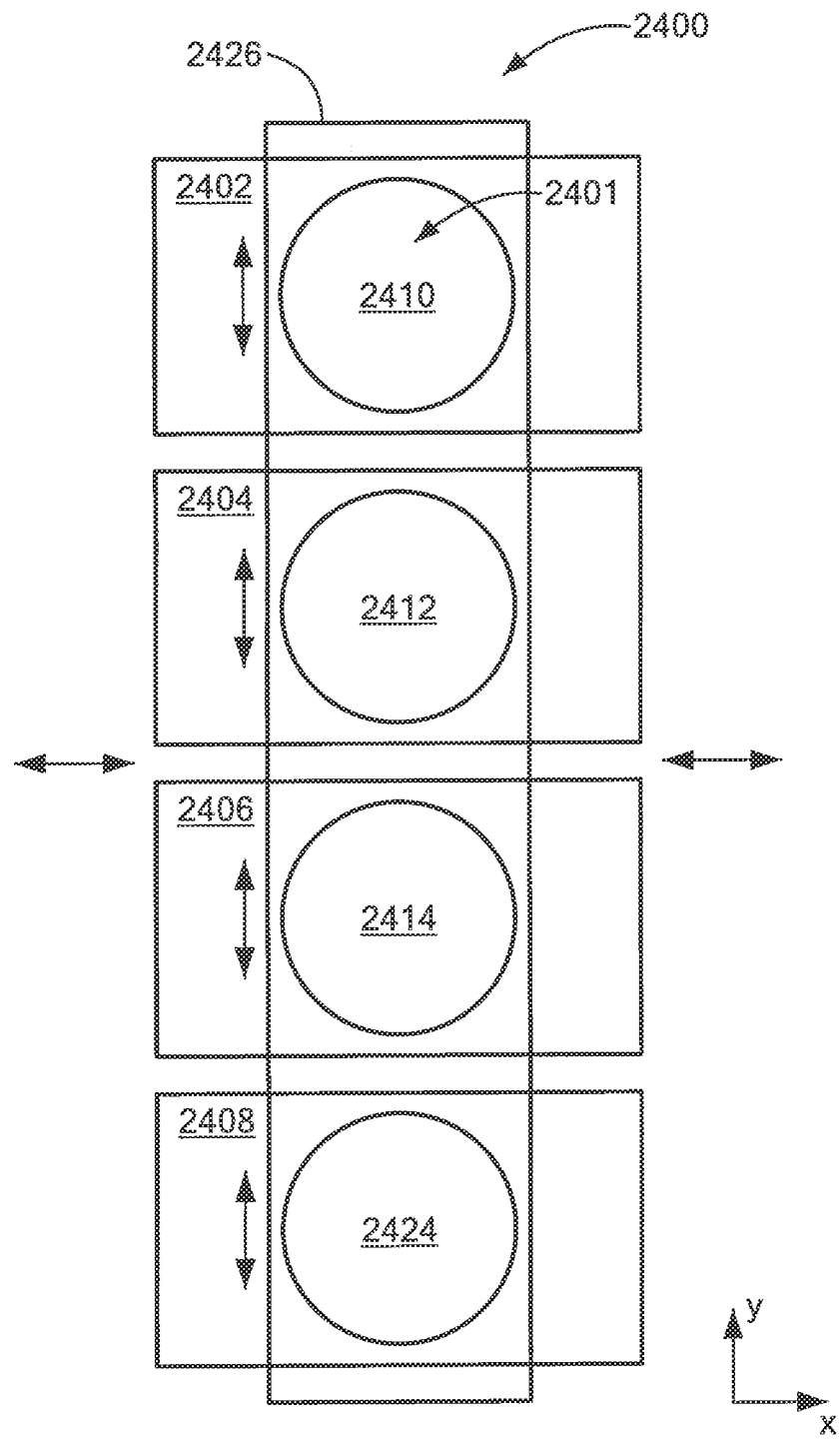
FIG. 24 is a block diagram showing the single TMR element of FIG. 15 having the plurality of TMR pillars, showing four current conductors that can be used to generate the four AC magnetic fields of FIG. 15 and also the other magnetic field of FIG. 15.

Referring now to FIG. 24, A TMR element 2401 can have a plurality of TMR pillars, e.g., four TMR pillars 2410, 2412, 2414, 2424, and can be the same as or similar to the TMR element 1508 of FIG. 15. A plurality of coils, e.g., four coils 2402, 2404, 2406, 2408, or other magnetic field generating structure can be the same as or similar to the plurality of coils 1508 of FIG. 15. The plurality of coils 2402, 2404, 2406, 2408 can be operable to generate a plurality of magnetic fields, e.g., four magnetic fields, each parallel to a y axis, passing through the plurality of TMR pillars.

Another coil 2426, or other magnetic field generating structure, can be the same as or similar to the coil 1512 of FIG. 15. The coil can be operable to generate a magnetic field parallel to an x axis, indicated by arrows between left and right of the page the page, passing through the plurality of TMR pillars.

In other embodiments, there can be different quantities of coils, or other magnetic field generating structures, to generate magnetic fields parallel to the x and y axes.

Figure 25:
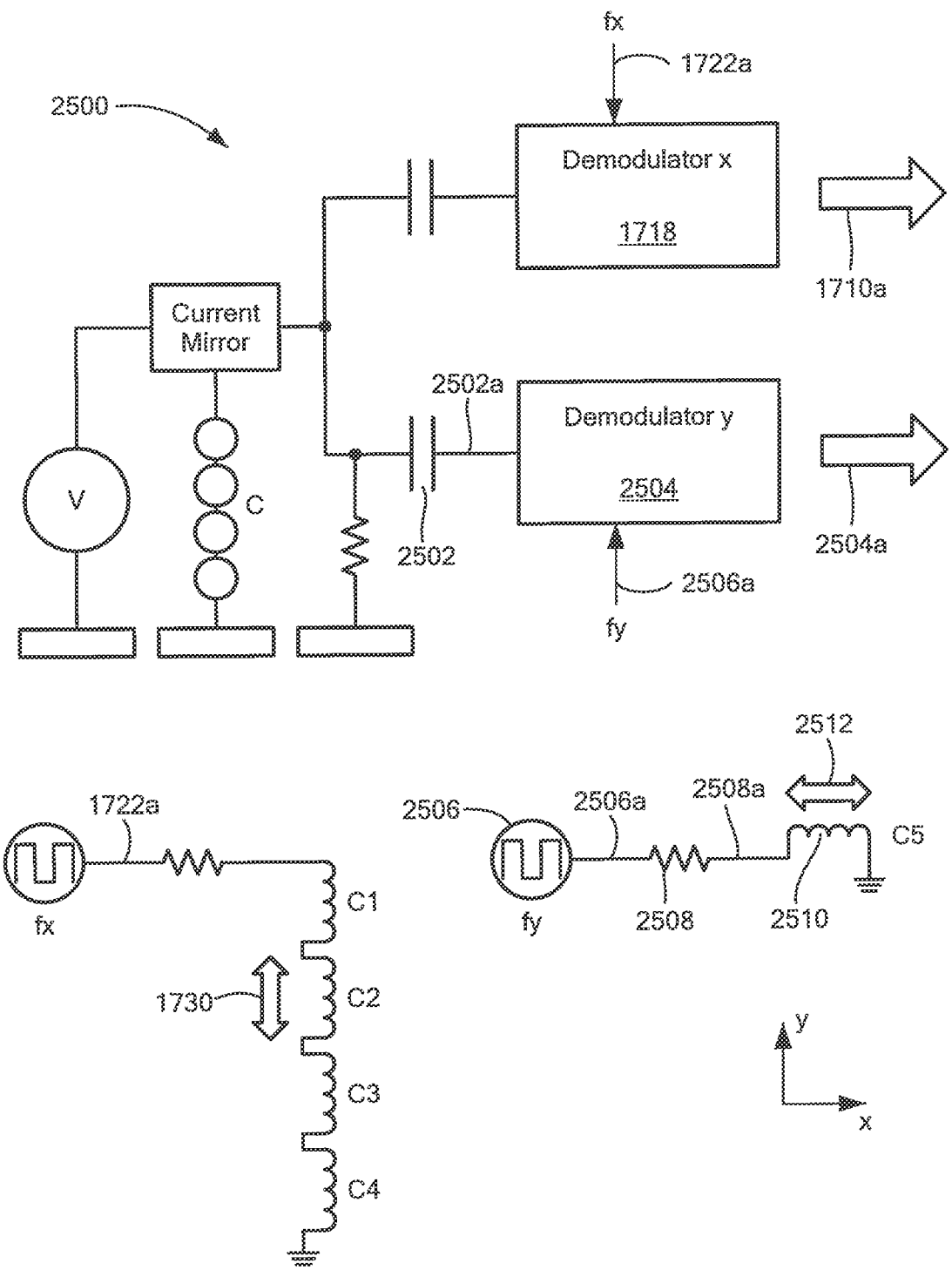
FIG. 25 is a block diagram showing a portion of a magnetic field sensor and having the single TMR element of FIGS. 15 and 15B coupled to first and second demodulators.

Referring now to FIG. 25, in which like elements of FIG. 17 are shown having like reference designations, a portion 2500 of a magnetic field sensor can include elements that will be recognized in FIG. 17. Unlike the portion 1700 of FIG. 17, a second demodulator 2504 replaces the low pass filter 1712 of FIG. 17. Also, the portion 2500 includes a second magnetic field generator 2506, 2508, 2510 for generating an AC magnetic field parallel to an x axis as indicated by an arrow 2512 and for generating a second clock signal 2506a, also labeled fy.

The first and second AC magnetic fields 1722, 2512 can have different frequencies, both frequencies preferably substantially higher than a highest frequency of an external (e.g., stray) magnetic field. In other embodiments, the first and second AC magnetic fields 1722, 2512 can have the same frequency.

A second capacitor 2502 can generate a second AC coupled signal 2502a received by the second demodulator 2504. The second demodulator can generate a second demodulated signal 2504a.

As described above in conjunction with FIG. 17, values of the signal 1710a are measured-x-dominant-values. As described in figures below, it will become apparent that values of the signal 2504 generated by the second demodulator 2504 are measured-y-dominant values, similar to values of the filtered signal 1712a of FIG. 17

Figure 26:
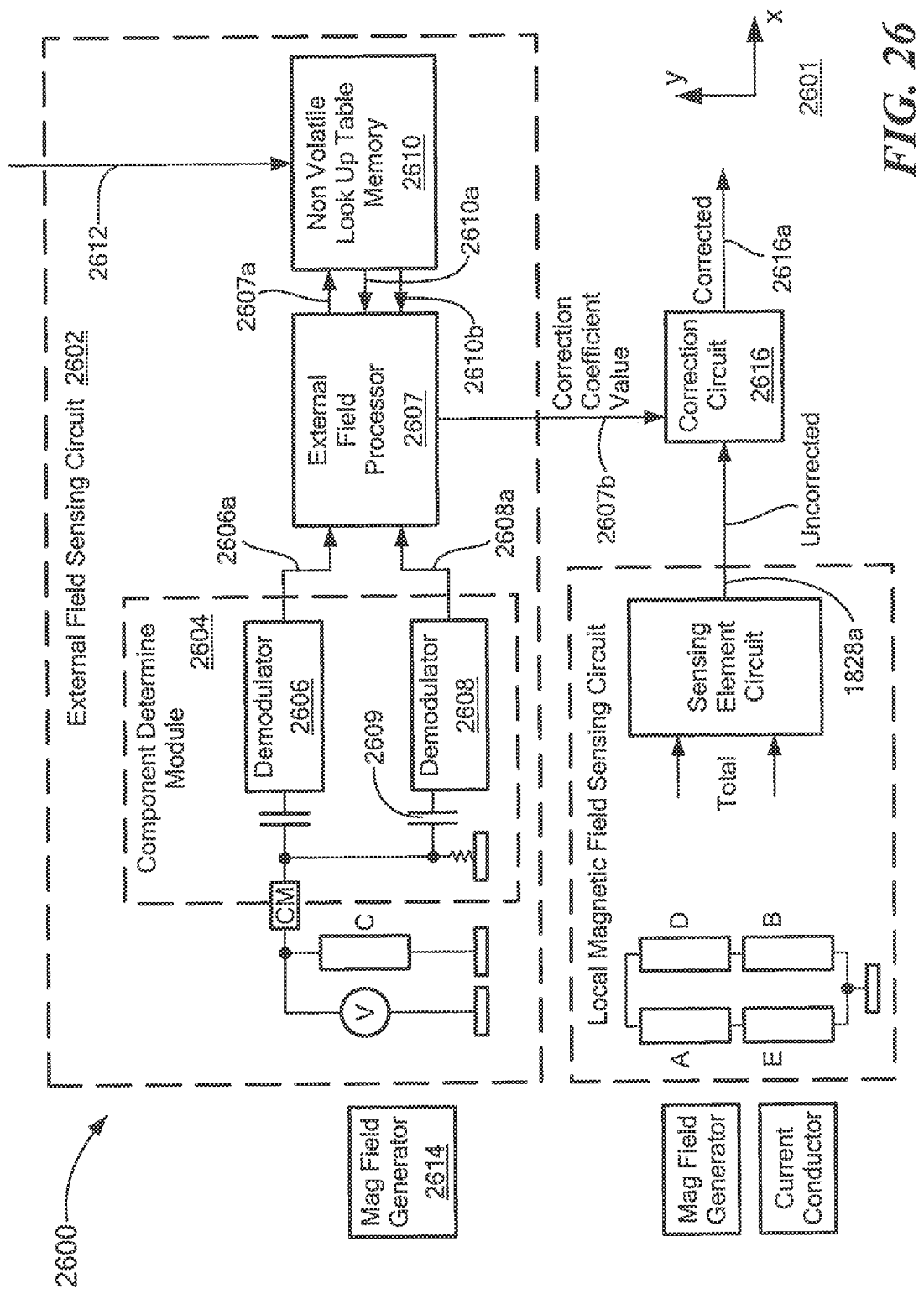
FIG. 26 is a block diagram of an illustrative magnetic field sensor having the plurality of magnetoresistance element and the single magnetoresistance element of FIGS. 15, 15A, 15B, and also including first and second demodulators, an external field processor, a non-volatile look up table memory, a sensing element circuit, and a correction circuit.

Referring now to FIG. 26, a magnetic field sensor 2600 can be disposed upon a surface of a substrate 2601, e.g., a semiconductor substrate. The surface can be upon an x-y plane. Most elements of the magnetic field sensor will be recognized in FIG. 18.

The magnetic field sensor 2600 can include an external field sensing circuit 2602 operable to sense and external (e.g., stray) magnetic field generated outside of the magnetic field sensor 2600.

The external field sensing circuit 2602 can also include a component determination module 2604 having a second capacitor 2609, a first demodulator 2606, and second demodulator 2608 the same as or similar to elements of FIG. 25, As described above in conjunction with FIG. 25, the external field sensing circuit 2602 is operable to generate a first demodulated signal 2606a primarily responsive to a component of stray magnetic field in the x direction, and a second demodulated signal 2608a primarily responsive to a component of the stray magnetic field in the y direction. However, it will become apparent from simulations in conjunction with FIGS. 27 and 28 that the signals 2606a, 2608a are only primarily responsive to the stated components, but are each responsive to both the components of the external magnetic field in the x direction and in the y direction. Thus, as described above in conjunction with FIGS. 17 and 18, values of the signals 2606a, 2608a can be referred to as measured-x-dominant values 2606a and measured-y-dominant values 2608a, respectively. The measured-x-dominant values 2606a are more indicative of x components and less indicative of a y components of the external magnetic field projected onto the x-y plane, but are responsive to both the components of the external magnetic field in the x direction and in the y direction. The measured-y-dominant values 2608a are more indicative of the y components and less indicative of the x components of the external magnetic field projected onto the x-y plane, but are responsive to both the components of the external magnetic field in the x direction and in the y direction.

The measured-x-dominant values 2606a and the measured-y-dominant values 2608a can be received by an external field processor 2607.

A non-volatile look up table memory 2610, for example, and EEPROM, can also be coupled to the external field processor 2607. The non-volatile look up table memory 2610 can store a matrix of correction coefficients received as a signal 2612 from outside of the magnetic field sensor 2600 prior to operation of the magnetic field sensor 2600.

Because a combination of the measured-x-dominant values 2606a and the measured-y-dominant values 2608a are deterministically indicative of actual x and y components, respectively, of the external magnetic field projected upon the x-y plane, values of the measured-x-dominant values 2626a and the values of the measured-y-dominant values 2620a can be used in combination to acquire a correction factor from the non-volatile look up table memory 2610, essentially using the non-volatile look up table memory 2610 as a look up table. To this end, the external field processor 2607 can send a control signal 2607a to the non-volatile look up table memory 2610 in accordance with the combination of the measured-x-dominant values 2606a and the measured-y-dominant values 2608b.

In operation, the external field processor 2607 can use selected ones of the predetermined x values 2610a and selected ones of the predetermined y values 2610b to generate a selected correction coefficient value 2607b.

Two magnetic field generators 2614, each having one or more coils, can be the same as or similar to the magnetic field generators having the coils C1, C2, C3, C4, C5 of FIG. 25 and can be disposed upon the substrate 2601.

The magnetic field sensor can include a correction circuit 2616 to receive the uncorrected signal 1828a (responsive to both the local and external magnetic fields) and to receive the selected correction coefficient value 2607b (responsive to the external (e.g., stray) magnetic field and substantially not responsive to the local magnetic field). The correction circuit 2616 can be operable to generate a corrected signal 2616a responsive to the local magnetic field and substantially not responsive to the external magnetic field. In some embodiments, the correction circuit performs a multiplication of the uncorrected signal 1828a by the selected correction coefficient value 2607b. Thus, a more accurate measurement of the local magnetic field alone is obtained.

Figure 27:
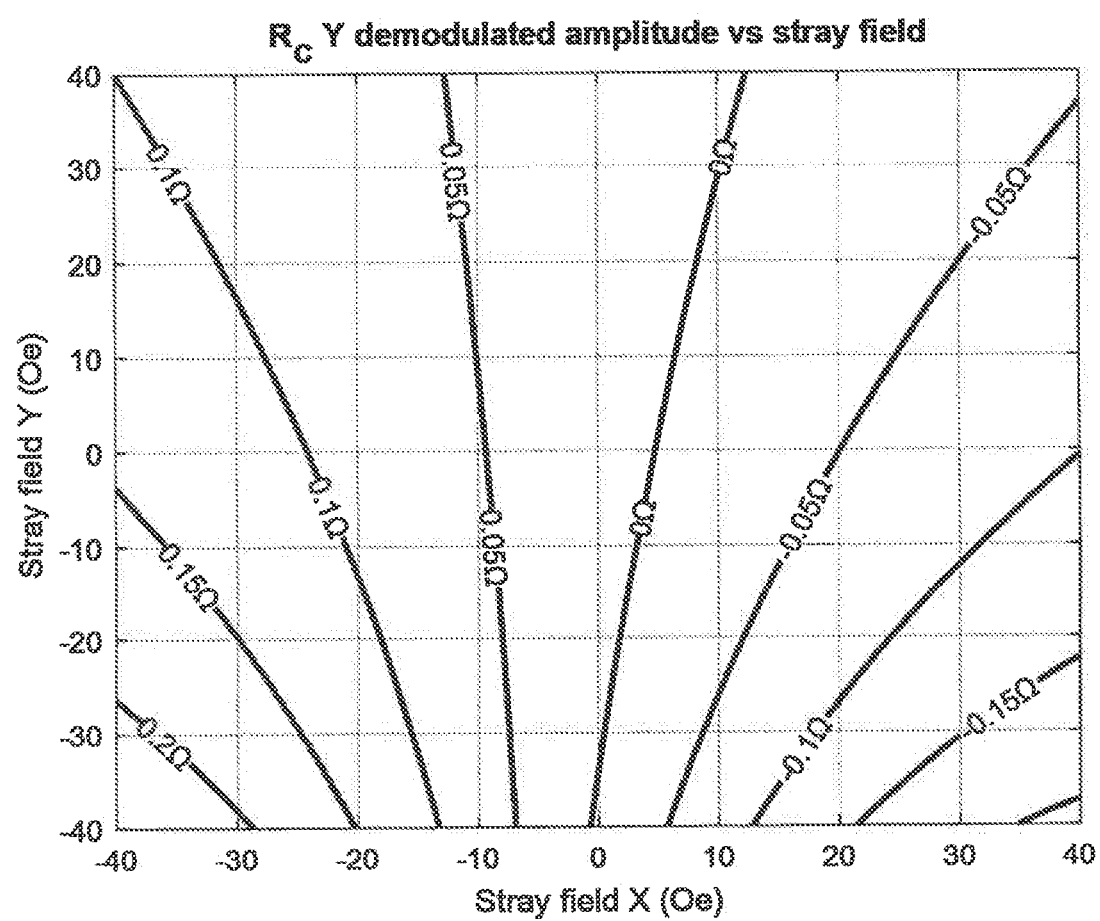
FIG. 27 is a graph showing a relationship of measured y-direction values of a signal generated by a first demodulator of FIGS. 25 and 26 when in the presence of various stray magnetic fields.

Referring now to FIG. 27, a graph has a horizontal axis with a scale in units of an x component of a stray magnetic field projected onto the x-y plane of the substrate of FIG. 26 in Oersteds. The graph also has a vertical axis with a scale in units of a y component of a stray magnetic field projected onto the x-y plane of the substrate of FIG. 26 in Oersteds.

Isolines are indicative of different measured-x-dominant values of the second demodulated signal 2608a generated by the second demodulator 2608. Vertical isolines would indicate that the second demodulated signal 2608a is indicative of only x components of the external (e.g., stray) magnetic field. However, the isolines are not vertical, and thus, the second demodulated signal has values that are indicative of both x and y components of the external magnetic field. The isolines are somewhat vertical. Thus, the values of the signal 2608a are referred to above as the measured-x-dominant values.

Figure 28:
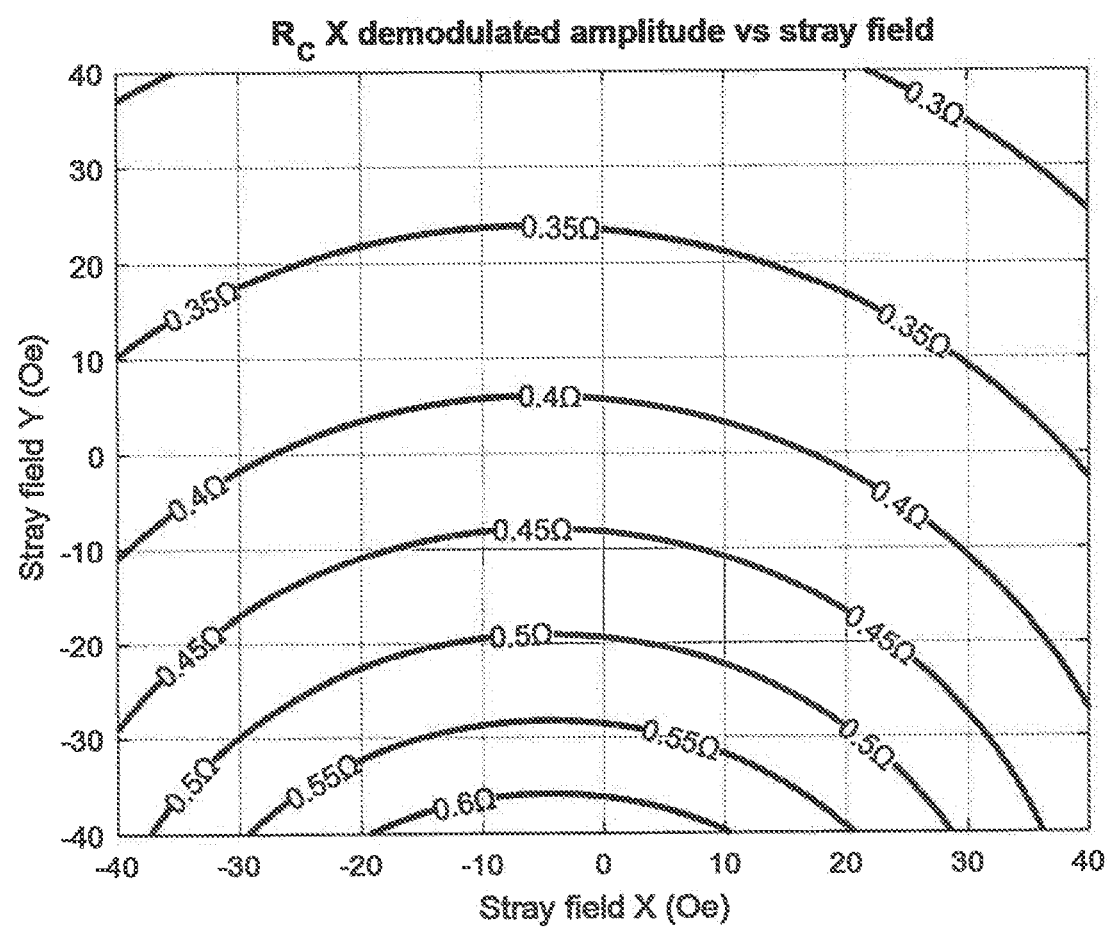
FIG. 28 is a graph showing a relationship of measured x-direction values of a signal generated by a second demodulator of FIGS. 25 and 26 when in the presence of various stray magnetic fields.

Referring now to FIG. 28, a graph has a horizontal axis with a scale in units of an x component of a stray magnetic field projected onto the x-y plane of the substrate 2601 of FIG. 26 in Oersteds. The graph also has a vertical axis with a scale in units of a y component of a stray magnetic field projected onto the x-y plane of the substrate of FIG. 26 in Oersteds.

Curves are isolines indicative of different measured-y-dominant values of the first demodulated signal 2606a generated by the first demodulator 2698. Horizontal isolines would indicate that the first demodulated signal 2606a is indicative of only y components of the external (e.g., stray) magnetic field. However, the isolines are not horizontal, and thus, the first demodulated signal 2606a has values that are indicative of both x and y components of the external magnetic field. The isolines are somewhat horizontal. Thus, the values of the signal 2606a are referred to above as the measured-y-dominant values.

Figure 29:
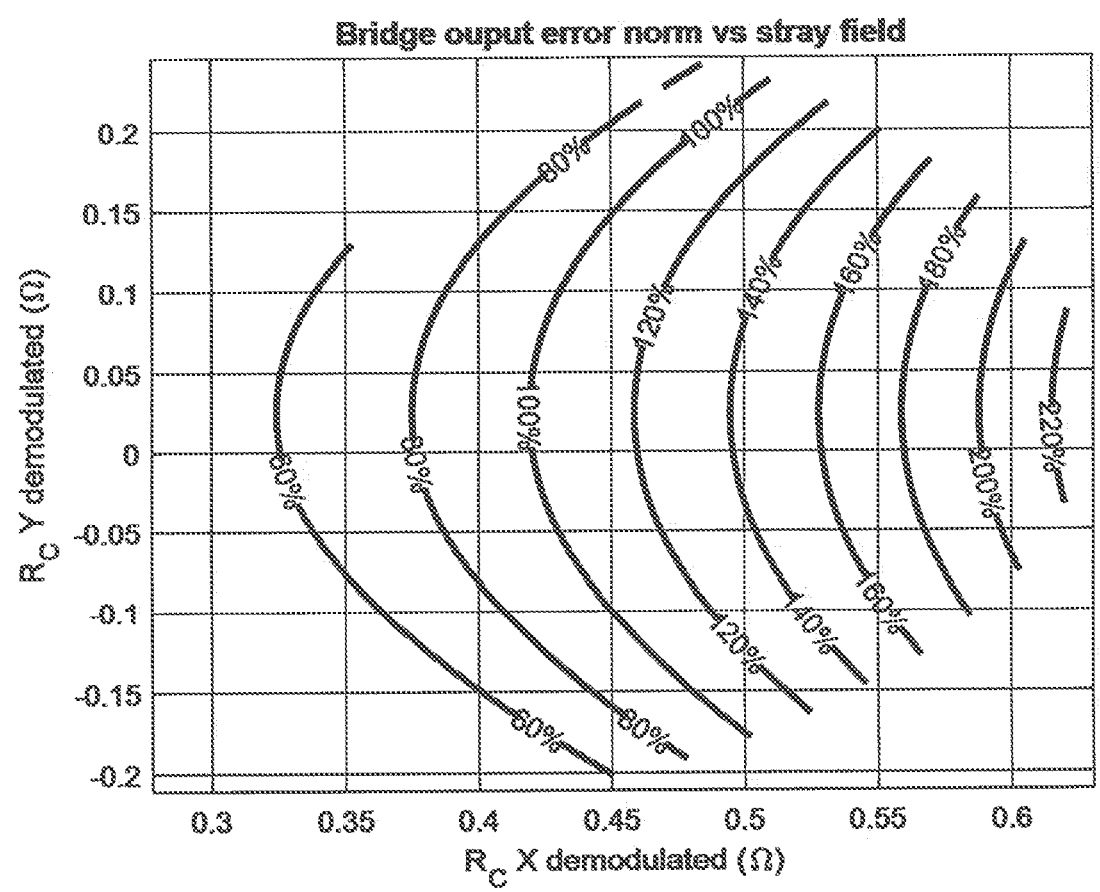
FIG. 29 is a graph showing normalized errors (100% best) from the plurality of magnetoresistance elements of FIG. 26 when arranged in a bridge as shown in FIG. 7, for different amplitudes of signal generated by the low pass filter and the demodulator of FIG. 26 when in the presence of various stray magnetic fields, normalized by a configuration without stray fields.

Referring now to FIG. 29, a graph has a horizontal axis with a scale in units of an x component of a stray magnetic field projected onto the x-y plane of the substrate 2601 of FIG. 26 in Oersteds. The graph also has a vertical axis with a scale in units of a y component of a stray magnetic field projected onto the x-y plane of the substrate of FIG. 26 in Oersteds.

Curves are isolines, each indicative of a different error of the uncorrected signal 1828a of FIG. 26. Errors range from about 40% to about 220%. These errors are errors prior to operation of the correction circuit 2616 of FIG. 26.

Figure 30:
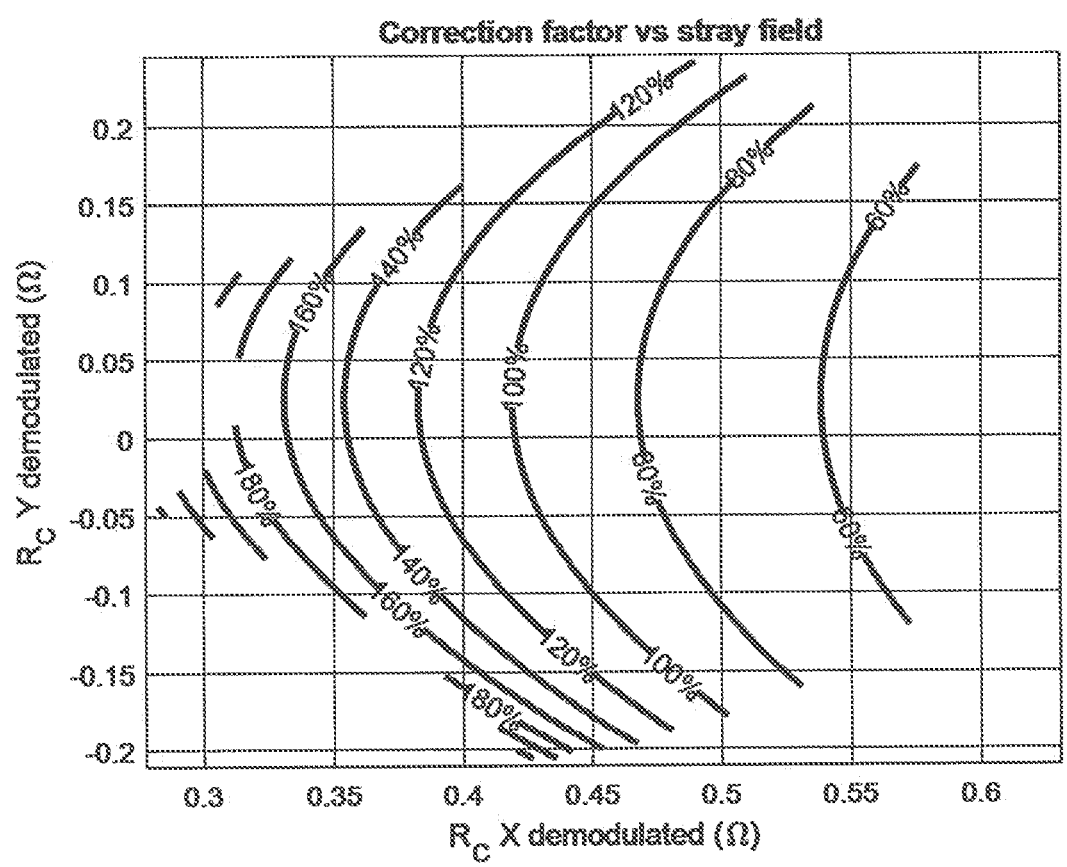
FIG. 30 is a graph showing correction factors that can be applied to a signal generated by the plurality of magnetoresistance elements arranged in the bridge of FIGS. 26 and 7 for different signal values generated by the low pass filter and by the demodulator of FIG. 26.

Referring now to FIG. 30, a graph has a horizontal axis with a scale in units of ohms for the measured-x-dominated values of the second demodulated signal 2608a of FIG. 18. The graph also has a vertical axis with a scale in units of ohms for the measured-y-dominated values of the first demodulated signal 2606a of FIG. 26.

Curves are isolines, each indicative of a different correction factors, i.e., a values of the external field signal 2607b, i.e., correction values, when in the presence of the external (e.g., stray) magnetic field. Correction values range from about 0.5 to about 2.4.

Correction using the external field signal 2607b results in much lower errors of the currents otherwise detected by the local magnetic field sensing circuit.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetic field sensor, comprising:
   a substrate having a major surface in an x-y plane having an x axis and a y axis;
   an external field sensing circuit disposed upon the substrate and responsive to an external magnetic field generated outside of the magnetic field sensor, the external field sensing circuit comprising:
      a first one or more magnetoresistance elements, each having a respective reference layer with a magnetic direction parallel to the y axis and in the x-y plane, the first one or more magnetoresistance elements operable to generate a magnetoresistance element signal responsive to the external magnetic field; and
      a component determination module coupled to receive the magnetoresistance element signal and operable to generate a measured x-dominant value and a measured y-dominant value, wherein the measured x-dominant value is indicative of an x component and a y component of the external magnetic field projected onto the x-y plane, wherein the measured x-dominant value more indicative of the x component and less indicative of the y component, wherein the measured y-dominant value is indicative of the x component and the y component, wherein the measured y-dominant value is more indicative of the y component and less indicative of the x component.

2. The magnetic field sensor of claim 1, wherein the external field sensing circuit further comprises:
   a nonvolatile look up table memory storing a plurality of predetermined correction coefficient values; and
   an external field processor coupled to receive the measured x-dominant value and the measured y-dominant value, wherein the external field processor is operable to select one of the plurality of predetermined correction coefficient values in accordance with the measured x-dominant value and the measured y-dominant value, wherein the magnetic field sensor further comprises:
   a correction circuit operable to combine an uncorrected signal with the selected correction coefficient value to generate a corrected signal indicative of a local magnetic field within the magnetic field sensor and substantially not responsive to the external magnetic field.

3. The magnetic field sensor of claim 2, wherein the first one or more magnetic field sensing elements are disposed at a position upon the substrate such that they are responsive to the external magnetic field but substantially unresponsive to the local magnetic field.

4. The magnetic field sensor of claim 1, wherein the external field sensing circuit further comprises:
a first current conductor operable to generate a first AC reference magnetic field parallel to the y axis and in the x-y plane, the first AC reference magnetic field proximate to the first one or more magnetoresistance elements, the first AC reference magnetic field having a first frequency; and
a second current conductor operable to generate a second AC reference magnetic field parallel to the x axis and in the x-y plane, the second AC reference magnetic field proximate to the first one or more magnetoresistance elements, the second AC reference magnetic field having a second frequency different than the first frequency.

5. The magnetic field sensor of claim 4, wherein the component determination module comprises:
a first demodulator coupled to the magnetoresistance element signal and coupled to receive a first clock signal with the first frequency, the first demodulator operable to demodulate the magnetoresistance element signal with the first clock signal to generate the measured x-dominant value; and
a second demodulator coupled to the magnetoresistance element signal and coupled to receive a second clock signal with the second frequency, the second demodulator operable to demodulate the magnetoresistance element signal with the second clock signal to generate the measured y-dominant value, wherein the first and second demodulators operate at the same time.

6. The magnetic field sensor of claim 1, wherein the external field sensing circuit further comprises:
a first current conductor operable to generate a first AC reference magnetic field parallel to the y axis and in the x-y plane, the first AC reference magnetic field proximate to the first one or more magnetoresistance elements, the first AC reference magnetic field having a first frequency; and
a second current conductor operable to generate a second AC reference magnetic field parallel to the y axis and in the x-y plane, the second AC reference magnetic field proximate to the first one or more magnetoresistance elements, the second AC reference magnetic field having the first frequency or a second frequency different than the first frequency.

7. The magnetic field sensor of claim 6, wherein the component determination module comprises:
a first demodulator coupled to the magnetoresistance element signal and coupled to receive a first clock signal with the first frequency, the first demodulator operable to demodulate the magnetoresistance element signal with the first clock signal to generate the measured x-dominant value; and
a second demodulator coupled to the magnetoresistance element signal and coupled to receive the first clock signal with the first frequency or a second clock signal with the second frequency, the second demodulator operable to demodulate the magnetoresistance element signal with the first clock signal or with the second clock signal to generate the measured y-dominant value, wherein the first and second demodulators are time multiplexed.

8. The magnetic field sensor of claim 6, wherein the component determination module comprises:
an amplitude detector circuit coupled to the magnetoresistance element signal and operable to generate the measured x-dominant value; and
a low pass filter coupled to the magnetoresistance element signal and operable to generate the measured y-dominant value.

9. The magnetic field sensor of claim 8, wherein the amplitude detector circuit comprises:
a rectifier; and
a filter coupled to the rectifier.

10. The magnetic field sensor of claim 1, wherein the external field sensing circuit further comprises:
a current conductor operable to generate an AC reference magnetic field in parallel to the y axis and in the x-y plane, the AC reference magnetic field proximate to the first one or more magnetoresistance elements, wherein the AC reference magnetic field has a predetermined frequency.

11. The magnetic field sensor of claim 10, wherein the component determination module comprises:
a demodulator coupled to the magnetoresistance element signal and coupled to receive a clock signal with the predetermined frequency, the demodulator operable to demodulate the magnetoresistance element signal with the clock signal to generate the measured x-dominant value; and
a low pass filter coupled to the magnetoresistance element signal and operable to generate the measured y-dominant value.

12. The magnetic field sensor of claim 1, further comprising:
a local magnetic field sensing circuit disposed upon the substrate, the local magnetic field sensing circuit responsive to a total magnetic field, wherein the total magnetic field comprises a vector sum of a local magnetic field generated proximate to the local magnetic field sensing circuit and the external magnetic field, the local magnetic field in a predetermined direction parallel to the x-y plane, wherein the local magnetic field sensing circuit is operable to generate an uncorrected signal indicative of an amplitude of the total magnetic field, wherein the external magnetic field is generated from outside of the magnetic field sensor, and wherein the x signal measured x-dominant value and the measured y dominant value are both substantially not indicative of the local magnetic field.

13. The magnetic field sensor of claim 12, wherein the first one or more magnetic field sensing elements are disposed at a position upon the substrate such that they are responsive to the external magnetic field but substantially unresponsive to the local magnetic field.

14. The magnetic field sensor of claim 12, wherein the local magnetic field sensing circuit comprises:
a second one or more magnetic field sensing elements having respective reference layers with magnetic directions parallel to each other and in the x-y plane, the second one or more magnetic field sensing elements operable to generate a total magnetic field signal responsive to the total magnetic field; and
a sensing element circuit coupled to the total magnetic field signal and operable to generate the uncorrected signal.

15. The magnetic field sensor of claim 14, wherein the first one or more magnetic field sensing elements are disposed at a position upon the substrate such that they are responsive to the external magnetic field but substantially unresponsive to the local magnetic field.

16. The magnetic field sensor of claim 14, wherein the external field sensing circuit further comprises:
a nonvolatile look up table memory storing a plurality of predetermined correction coefficient values; and
an external field processor coupled to receive the measured x-dominant value and the measured y-dominant value, wherein the external field processor is operable to select one of the plurality of predetermined correction coefficient values in accordance with the measured x-dominant value and the measured y-dominant value; and
a correction circuit operable to combine the uncorrected signal with the selected correction coefficient value to generate a corrected signal indicative of the local magnetic field and substantially not responsive to the external magnetic field.

17. The magnetic field sensor of claim 1, further comprising:
a local magnetic field generator disposed upon the substrate and operable to generate a local magnetic field.

18. The magnetic field sensor of claim 17, wherein the first one or more magnetic field sensing elements are disposed at a position upon the substrate such that they are responsive to the external magnetic field but substantially unresponsive to the local magnetic field.

19. A method in a magnetic field sensor, comprising:
generating, with a first one or more magnetoresistance elements disposed upon a substrate having a major surface in an x-y plane with an x axis and a y axis, a magnetoresistance element signal responsive to an external magnetic field generated outside of the magnetic field sensor, wherein the first one or more magnetoresistance elements each have a respective reference layer with a magnetic direction parallel to the y axis and in the x-y plane; and
generating a measured x-dominant value and a measured y-dominant value, wherein the measured x-dominant value is indicative of an x component and a y component of the external magnetic field projected onto the x-y plane, wherein the measured x-dominant value more indicative of the x component and less indicative of the y component, wherein the measured y-dominant value is indicative of the x component and the y component, wherein the measured y-dominant value is more indicative of they component and less indicative of the x component.

20. The method of claim 19, further comprising
storing, in a nonvolatile look up table memory, a plurality of predetermined correction coefficient values;
selecting one of the plurality of predetermined correction coefficient values in accordance with the measured x-dominant value and the measured y-dominant value; and
combining an uncorrected signal with the selected correction coefficient value to generate a corrected signal indicative of a local magnetic field within the magnetic field sensor and substantially not responsive to the external magnetic field.

21. The method of claim 20, wherein the first one or more magnetic field sensing elements are disposed at a position upon the substrate such that they are responsive to the external magnetic field but substantially unresponsive to the local magnetic field.

22. The method of claim 19, further comprising:
generating, with a first current conductor, a first AC reference magnetic field parallel to the y axis and in the x-y plane, the first AC reference magnetic field proximate to the first one or more magnetoresistance elements, the first AC reference magnetic field having a first frequency; and
generating, with a second current conductor, a second AC reference magnetic field parallel to the x axis and in the x-y plane, the second AC reference magnetic field proximate to the first one or more magnetoresistance elements, the second AC reference magnetic field having a second frequency different than the first frequency.

23. The method of claim 22, further comprising:
demodulating the magnetoresistance element signal, in a first demodulation, with a first clock signal having the first frequency to generate the measured x-dominant value; and
demodulating the magnetoresistance element signal, in a second demodulation, with a second clock signal having the second frequency to generate the measured y-dominant value, wherein the first and second demodulations operate at the same time.

24. The method of claim 19, further comprising:
generating, with a first current conductor, a first AC reference magnetic field parallel to the y axis and in the x-y plane, the first AC reference magnetic field proximate to the first one or more magnetoresistance elements, the first AC reference magnetic field having a first frequency; and
generating, with a second current conductor, a second AC reference magnetic field parallel to the x axis and in the x-y plane, the second AC reference magnetic field proximate to the first one or more magnetoresistance elements, the second AC reference magnetic field having the first frequency or a second frequency different than the first frequency.

25. The method of claim 24, further comprising:
demodulating the magnetoresistance element signal, in a first demodulation, with a first clock signal having the first frequency to generate the measured x-dominant value; and
demodulating the magnetoresistance element signal, in a second demodulation, with the first clock signal having the second frequency or with a second clock signal having the second frequency to generate the measured y-dominant value, wherein the first and second demodulations are time multiplexed.

26. The method of claim 24, further comprising:
with an amplitude detector circuit coupled to the magnetoresistance element signal, generating the measured x-dominant value; and
with a low pass filter coupled to the magnetoresistance element signal, generating the measured y-dominant value.

27. The method of claim 26, wherein the amplitude detector circuit comprises:
a rectifier; and
a filter coupled to the rectifier.

28. The method of claim 19, further comprising:
generating, with a current conductor, an AC reference magnetic field parallel to the y axis and in the x-y plane, the AC reference magnetic field proximate to the first one or more magnetoresistance elements, wherein the AC reference magnetic field has a predetermined frequency.

29. The method of claim 28, further comprising:
demodulating the magnetoresistance element signal with a clock signal to generate the measured x-dominant value; and
filtering the magnetoresistance element signal to generate the measured y-dominant value.

30. The method of claim 19, further comprising:
generating, with a local magnetic field sensing circuit, an uncorrected signal, the local magnetic field sensing circuit disposed upon the substrate, the local magnetic field sensing circuit responsive to a total magnetic field, wherein the total magnetic field comprises a vector sum of a local magnetic field generated proximate to the local magnetic field sensing circuit and the external magnetic field, the local magnetic field in a predetermined direction parallel to the x-y plane, the uncorrected signal indicative of an amplitude of the total magnetic field, wherein the external magnetic field is generated from outside of the magnetic field sensor, and wherein the measured x-dominant value and the measured y-dominant value are both substantially not indicative of the local magnetic field.

31. The method of claim 30, wherein the first one or more magnetic field sensing elements are disposed at a position upon the substrate such that they are responsive to the external magnetic field but substantially unresponsive to the local magnetic field.

32. The method of claim 30, wherein the local magnetic field sensing circuit comprises:
a second one or more magnetic field sensing elements having respective reference layers with magnetic directions parallel to each other and in the x-y plane, the second one or more magnetic field sensing elements operable to generate a total magnetic field signal responsive to the total magnetic field; and
a sensing element circuit coupled to the total magnetic field signal and operable to generate the uncorrected signal.

33. The method of claim 32, wherein the first one or more magnetic field sensing elements are disposed at a position upon the substrate such that they are responsive to the external magnetic field but substantially unresponsive to the local magnetic field.

34. The method of claim 32, further comprising:
storing, in a nonvolatile look up table memory, a plurality of predetermined correction coefficient values; and
selecting one of the plurality of predetermined correction coefficient values in accordance with the measured x-dominant value and the measured y-dominant value; and
combining the uncorrected signal with the selected correction coefficient value to generate a corrected signal indicative of the local magnetic field and substantially not responsive to the external magnetic field.

* * * * *

UNITED STATES PATENT AND TRADEMARK OFFICE
CERTIFICATE OF CORRECTION

PATENT NO. : 10,746,820 B2
APPLICATION NO. : 16/157317
DATED : August 18, 2020
INVENTOR(S) : Rémy Lassalle-Balier et al.

Page 1 of 3

It is certified that error appears in the above-identified patent and that said Letters Patent is hereby corrected as shown below:

In the Specification

Column 1, Line 4 delete "layer so-called" and replace with --so-called--.

Column 2, Line 18 delete "describes and" and replace with --describes an--.

Column 3, Line 3 delete "more" and replace with --is more--.

Column 3, Line 23 delete "more" and replace with --is more--.

Column 3, Line 33 delete "itself" and replace with --itself,--.

Column 3, Line 62 delete "FIG." and replace with --FIGS.--.

Column 4, Line 14 delete "13" and replace with --12--.

Column 5, Line 3 delete "14" and replace with --14,--.

Column 5, Line 45 delete "element" and replace with --elements--.

Column 6, Line 13 delete "refer" and replace with --refers--.

Column 6, Line 45 delete "and tend" and replace with --tend--.

Column 7, Line 3 delete "terms" and replace with --term--.

Column 7, Line 49 delete "as" and replace with --is--.

Column 8, Line 2 delete "in-part" and replace with --in part--.

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)

Column 8, Line 24 delete "embodiments" and replace with --embodiments,--.

Column 8, Line 45 delete "that" and replace with --that the--.

Column 8, Line 60 delete "referring" and replace with --referred--.

Column 8, Line 62 delete "to" and replace with --to as--.

Column 9, Line 2 delete "layers" and replace with --layer--.

Column 9, Lines 19-20 delete "above mentioned-currents" and replace with --above-mentioned currents--.

Column 9, Line 54 delete "referring" and replace with --referred--.

Column 10, Line 3 delete "layers" and replace with --layer--.

Column 10, Lines 9-10 delete "above mentioned-currents" and replace with --above-mentioned currents--.

Column 11, Line 21 delete "and" and replace with --an--.

Column 11, Line 47 delete "element" and replace with --elements--.

Column 12, Line 9 delete "experience" and replace with --experienced--.

Column 14, Line 24 delete "4." and replace with --4--.

Column 14, Line 65 delete "and AC" and replace with --an AC--.

Column 15, Line 46 delete "coils 1022, 1022" and replace with --coils 1020, 1022--.

Column 15, Line 49 delete "coils 1022, 1022" and replace with --coils 1020, 1022--.

Column 15, Line 57 delete "generate" and replace with --generated--.

Column 16, Line 29 delete "of the of" and replace with --of the--.

Column 17, Line 16 delete "that" and replace with --than--.

Column 17, Line 20 delete "that" and replace with --than--.

Column 17, Line 21 delete "frequencies" and replace with --frequencies.--.

Column 18, Line 36 delete "and" and replace with --an--.

Column 18, Line 39 delete "(or,".

Column 18, Line 67 delete "they axis" and replace with --the y axis--.

Column 20, Line 46 delete "and," and replace with --and--.

Column 21, Line 24 delete "received by" and replace with --received--.

Column 25, Line 34 delete "the page the page" and replace with --the page--.

Column 26, Line 5 delete "and" and replace with --an--.

Column 26, Line 12 delete "25," and replace with --25.--.

Column 26, Line 30 delete "of a y" and replace with --of y--.

In the Claims

Column 29, Line 42 Claim 6 delete "the y axis" and replace with --the x axis--.

Column 30, Line 50 Claim 12 delete "y dominant" and replace with --y-dominant--.

Column 31, Line 52 Claim 19 delete "they" and replace with --the y--.